(12) United States Patent
Hong et al.

(10) Patent No.: US 11,456,349 B2
(45) Date of Patent: Sep. 27, 2022

(54) DISPLAY DEVICE HAVING FLEXIBLE FILM WITH WINDOW PORTION

(71) Applicant: SAMSUNG DISPLAY CO., LTD., Yongin-si (KR)

(72) Inventors: Jung Pyo Hong, Hwaseong-si (KR); So Ra Bak, Suwon-si (KR); Jong Woo Park, Seongnam-si (KR); Su In Jin, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 56 days.

(21) Appl. No.: 16/928,322

(22) Filed: Jul. 14, 2020

(65) Prior Publication Data

US 2021/0202650 A1 Jul. 1, 2021

(30) Foreign Application Priority Data

Dec. 31, 2019 (KR) .................. 10-2019-0179861

(51) Int. Cl.
*H01L 27/32* (2006.01)
*H01L 23/00* (2006.01)
(Continued)

(52) U.S. Cl.
CPC ...... *H01L 27/3276* (2013.01); *H01L 23/4985* (2013.01); *H01L 24/32* (2013.01); *H01L 22/12* (2013.01); *H01L 2224/32225* (2013.01)

(58) Field of Classification Search
CPC . H01L 27/3276; H01L 23/4985; H01L 24/32; H01L 22/12; H01L 2224/32225;
(Continued)

(56) References Cited

U.S. PATENT DOCUMENTS 6,285,433 B1 * 9/2001 Kawasaki ............... H01R 4/04
349/149
2013/0264103 A1 * 10/2013 Ye ......................... H05K 1/0277
174/254
(Continued)

FOREIGN PATENT DOCUMENTS

CN 111029325 A * 4/2020
JP 2006-120471 5/2006
(Continued)

*Primary Examiner* — Lex H Malsawma
*Assistant Examiner* — Laura M Dykes
(74) *Attorney, Agent, or Firm* — F. Chau & Associates, LLC

(57) ABSTRACT

A display device includes a display substrate including a display area and a pad area located around the display area, a plurality of light emitting elements located on the display area of the display substrate, a plurality of pads located on the pad area of the display substrate and connected to the plurality of light emitting elements, a flexible film attached to the display substrate, a plurality of lead wires disposed on the flexible film, and an anisotropic conductive film disposed between the display substrate and the flexible film. The anisotropic conductive film is disposed between each of the plurality of pads and a corresponding one of the plurality of lead wires overlapping each other to form an electrical connection therebetween. The flexible film has a light transmittance of 60% or more with respect to a visible light wavelength range.

19 Claims, 23 Drawing Sheets

(51) Int. Cl.
*H01L 23/498* (2006.01)
*H01L 21/66* (2006.01)

(58) Field of Classification Search
CPC . H01L 27/32; H01L 51/52; G09G 2300/0426;
G09G 3/035; G09G 3/006; G02F
1/13452; H05K 3/323
USPC .......................................................... 257/91
See application file for complete search history.

(56) References Cited

U.S. PATENT DOCUMENTS

2017/0200709 A1* 7/2017 Kim ..................... H01L 23/5385
2019/0067406 A1* 2/2019 Lee ....................... H01L 23/544

FOREIGN PATENT DOCUMENTS

| JP | 2009-086119 | 4/2009 |
| JP | 2009-157186 | 7/2009 |
| KR | 10-0657154 | 12/2006 |
| KR | 10-0683152 | 2/2007 |

\* cited by examiner

120: GE, CE1
130: CE2
140: SE, DE, ELVDDE, PAD
150: DL, CNE, ELVDDL

DISPLAY DEVICE HAVING FLEXIBLE FILM WITH WINDOW PORTION

CROSS-REFERENCE TO RELATED APPLICATION

This application claims priority from Korean Patent Application No. 10-2019-0179861 filed on Dec. 31, 2019 in the Korean Intellectual Property Office, and all the benefits accruing therefrom under 35 U.S.C. 119, the contents of which are herein incorporated by reference in its entirety.

BACKGROUND

1. Technical Field

The present disclosure relates to a display device, more particularly, a display device with a window for monitoring a curing process of an anisotropic conductive film nondestructively.

2. Description of the Related Art

A display device is a device for visually displaying data. The display device includes a substrate partitioned into a display area and a non-display area. A plurality of pixels are disposed on the substrate in the display area, and a plurality of pads and the like are disposed on the substrate in the non-display area. A flexible film (Chip on Film (COF)) having a driving circuit and the like is coupled to the plurality of pads to transmit a driving signal to the pixels.

The flexible film may include a plurality of leads coupled to the plurality of pads, and the leads may be bonded to the pads separated from each other. The bonding may be performed by an anisotropic conductive film (ACF) disposed between the lead and the pad.

SUMMARY

Aspects of the present disclosure provide a display device capable of measuring the degree of cure of an anisotropic conductive film bonding a printed circuit film to a display panel without peeling off the printed circuit film.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an exemplary embodiment of the present inventive concept, a display device includes a display substrate including a display area and a pad area located around the display area, a plurality of light emitting elements located on the display area of the display substrate, a plurality of pads located on the pad area of the display substrate and connected to the plurality of light emitting elements, a flexible film attached to the display substrate, a plurality of lead wires disposed on the flexible film, and an anisotropic conductive film disposed between the display substrate and the flexible film. The anisotropic conductive film is disposed between each of the plurality of pads and a corresponding one of the plurality of lead wires overlapping each other to form an electrical connection therebetween. The flexible film has a light transmittance of 60% or more with respect to a visible light wavelength range.

The display device further includes an insulating resin disposed on the flexible film. The flexible film includes a window portion disposed between two lead wires adjacent to each other in a plan view. The insulating resin is disposed between the two lead wires adjacent to each other without overlapping the window portion.

The window portion is surrounded by the insulating resin in the plan view.

The insulating resin includes an opening passing therethrough in a thickness direction. The opening is disposed to overlap the window portion.

A portion of the anisotropic conductive film fills the opening of the insulating resin.

The insulating resin includes an optically opaque insulating material.

The opening has the same planar shape and size as the window portion.

The flexible film includes transparent polyimide (PI) or transparent cyclo-olefin polymer (COP).

The anisotropic conductive film is prepared through an ultraviolet curing or thermal curing process.

The portion of the anisotropic conductive film is visible through the window portion, and the window portion is configured to pass through light for measuring a degree of cure of the anisotropic conductive film subjected to a curing process.

According to an exemplary embodiment of the present inventive concept, a display device includes a display substrate including a display area and a pad area located around the display area, a plurality of light emitting elements located on the display area, a plurality of pads located on the pad area and connected to the plurality of light emitting elements, a flexible film attached to the display substrate, a plurality of lead wires disposed on the flexible film, an insulating resin disposed on the flexible film, and an anisotropic conductive film disposed between the display substrate and the flexible film, wherein the anisotropic conductive film is disposed between each of the plurality of pads and a corresponding one of the plurality of lead wires overlapping each other to form an electrical connection therebetween. The flexible film includes a first opening as a window portion. The first opening passes through the flexible film and is disposed between two lead wires adjacent to each other in a plan view. The insulating resin is disposed between the two lead wires adjacent to each other without overlapping window portion.

The window portion is surrounded by the insulating resin in the plan view.

The insulating resin includes a second opening passing therethrough in a thickness direction, and the second opening is disposed to overlap the first opening.

A portion of the anisotropic conductive film fills the second opening of the insulating resin.

The insulating resin includes an optically opaque insulating material, and the second opening has the same planar shape and size as the first opening.

According to an exemplary embodiment of the present inventive concept, a display device includes a display substrate including a display area and a pad area located around the display area, a plurality of light emitting elements located on the display area, a plurality of pads located on the pad area and connected to the plurality of light emitting elements, a flexible film attached to the display substrate, a plurality of lead wires disposed on the flexible film, the flexible film including a first opening as a window portion between two lead wires adjacent to each other in a plan view, and the first opening passing through the flexible film, a filling resin filling the first opening of the flexible film, and an anisotropic conductive film disposed between the display substrate and the flexible film, wherein the anisotropic conductive film is disposed between each of the plurality of pads and a corresponding one of the plurality of lead wires overlapping each other to form an electrical connection therebetween.

A light transmittance of the filling resin is greater than a light transmittance of the flexible film.

The display device further includes an insulating resin disposed on the flexible film. The insulating resin is disposed between two lead wires adjacent to each other without overlapping the window portion.

The insulating resin includes a second opening passing therethrough in a thickness direction, and the second opening is disposed to overlap the filling resin filling the first opening.

The insulating resin includes an optically opaque insulating material, and the second opening has the same planar shape and size as the filling resin.

According to the display device according to the embodiments of the present disclosure, it is possible to measure the degree of cure of the anisotropic conductive film bonding the printed circuit film to the display panel without peeling off the printed circuit film, thereby increasing the yield.

The effects of the present disclosure are not limited to the above-described effects and other effects which are not described herein will become apparent to those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
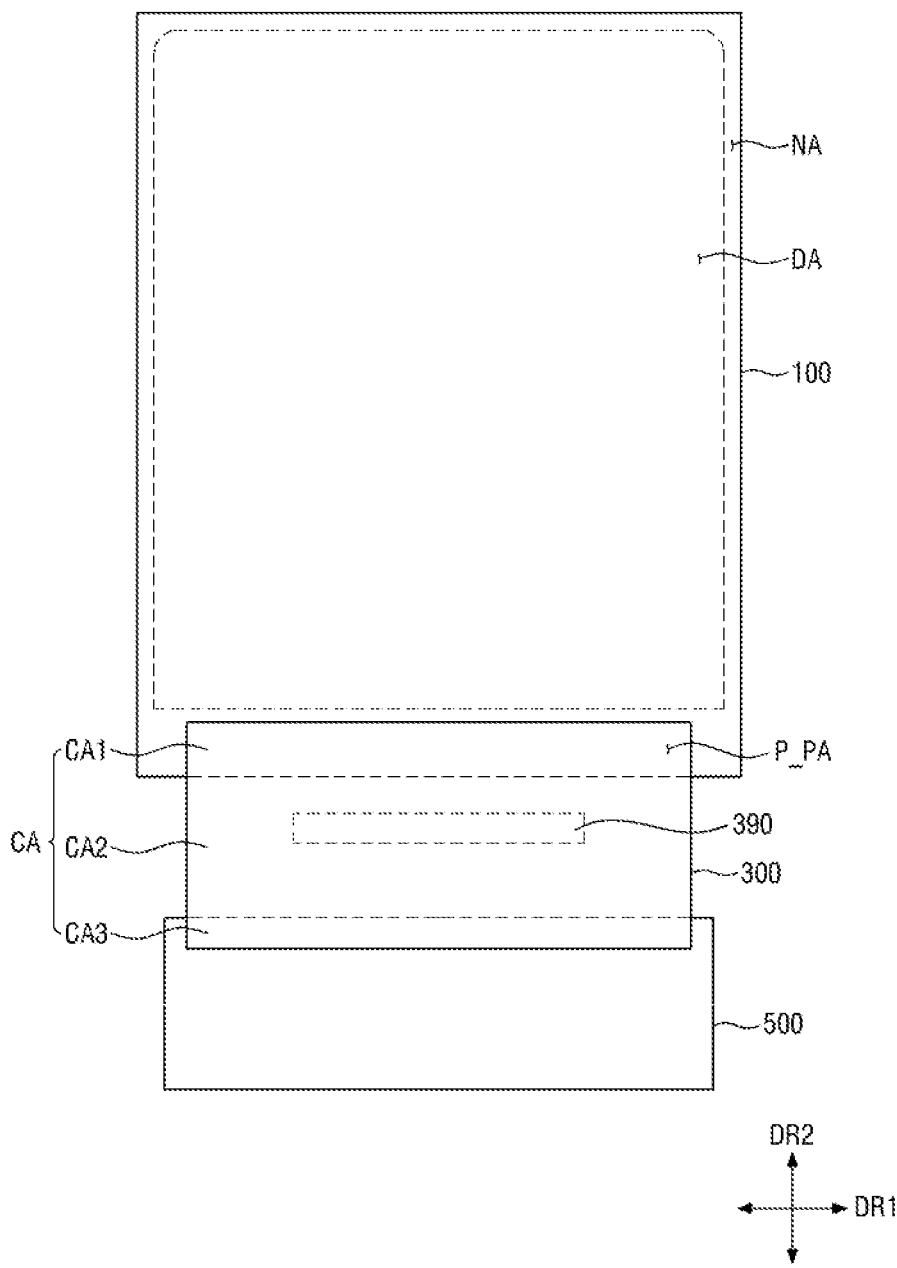
FIG. 1 is a plan layout view of a display device according to an exemplary embodiment.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below", or "beneath" other elements would then be oriented "above" the other elements. The exemplary terms "below" or "beneath" can, therefore, encompass both an orientation of above and below.

Hereinafter, embodiments of the invention will be described with reference to the attached drawings.

Figure 2:
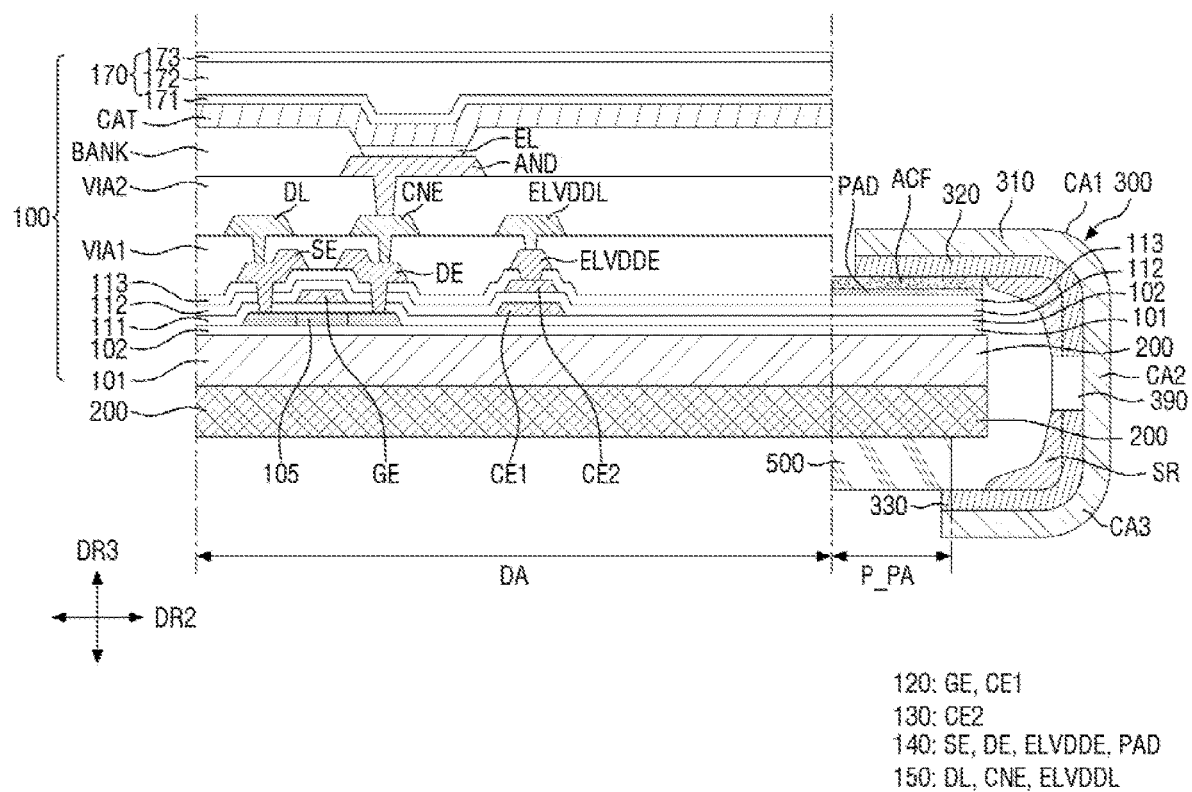
FIG. 2 is a cross-sectional view of the display device of FIG. 1.

FIG. 1 is a plan layout view of a display device according to an exemplary embodiment. FIG. 2 is a cross-sectional view of the display device of FIG. 1.

A display device 1 is a device for displaying a moving image or a still image. The display device may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

Referring to FIGS. 1 and 2, the display device 1 may include a display panel 100 configured to display an image, a printed circuit film 300 connected to the display panel 100, and a main circuit board 500 connected to the printed circuit film 300.

The display panel 100 may be, for example, an organic light emitting display panel. In the following embodiments, a case where the organic light emitting display panel is used as the display panel 100 will be described as an example, but the present disclosure is not limited thereto, and other types of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be used as the display panel 100.

The display panel 100 includes a display area DA including a plurality of pixel areas and a non-display area (i.e., a non-pixel area) NA disposed around the display area DA. The display area DA may have a rectangular shape with right-angled or rounded corners in a plan view. The display area DA may have short and long sides. The short side of the display area DA may be a side extending in a first direction DR1. The long side of the display area DA may be a side extending in a second direction DR2. However, the planar shape of the display area DA is not limited to a rectangular shape, but may have a circular shape, an elliptical shape, or various other shapes. The non-display area NA may be disposed adjacent to the short sides and the long sides of the display area DA. For example, the edges of the display area DA may be formed to surround all sides of the display area DA. However, the present disclosure is not limited thereto, and the non-display area NA may be disposed adjacent to opposite short sides or opposite long sides of the display area DA.

The non-display area NA of the display panel 100 further includes a panel pad area P_PA. For example, the panel pad area P_PA may be disposed near one short side of the display area DA, but the present disclosure is not limited thereto. The panel pad areas P_PA may be disposed near opposite short sides of the display area DA, or may be disposed near opposite short sides and opposite long sides of the display area DA.

The display panel 100 may include a first member (i.e., a display substrate) 101, a plurality of light emitting elements of the display area DA disposed on the first member 101, and a plurality of pads PAD of the non-display area NA. The display panel 100 may include a plurality of insulating layers and a plurality of conductive layers. A detailed stacked structure of the display panel 100 will be described later. The first member 101 may be a rigid substrate including glass, quartz, or the like. In some embodiments, the first member 101 may be a plastic substrate including a plastic material. In some embodiments, the first member 101 may be a film including polyimide (PI).

The printed circuit film 300 may include a second member (or a flexible base film or a flexible film) 310 and a driving integrated circuit 390 disposed on the second member 310. The second member 310 may include an insulating material. The second member 310 may include a material having high light transmittance with respect to visible light. The second member 310 may include a material having light transmittance of 60% or more with respect to visible light. For example, the light transmittance of the second member 310 with respect to visible light may be transmittance between 70% and 90%. The second member 310 may include transparent polyimide (PI) or transparent cyclo-olefin polymer (COP). The transparent polyimide (PI) may be formed by substituting fluorine ions (F—) for some of monomers constituting the polyimide (PI). For example, the transparent polyimide (PI) may further include fluorine ions (F—).

The printed circuit film 300 may include a first circuit area CA1 having a first side attached to the panel pad area P_PA of the display panel 100, a second circuit area CA2 disposed on a second side, opposite the first side, of the first circuit area CA1 in the second direction DR2, and a third circuit area CA3 which is disposed on one side of the second circuit area CA2 in the second direction DR2 and to which the main circuit board 500 is attached. The driving integrated circuit 390 may be disposed on one a surface of the second circuit area CA2 of the printed circuit film 300. The driving integrated circuit 390 may be, for example, a data driving integrated circuit, and may be implemented as a data driving chip by using a chip on film (COF) method.

The main circuit board 500 may include a circuit pad area attached to the third circuit area CA3 of the printed circuit film 300. A plurality of circuit pads may be disposed on the circuit pad area of the main circuit board 500 and connected to the lead wires disposed on the third circuit area CA3 of the printed circuit film 300.

Referring to FIG. 2, the display device 1 further includes a panel lower sheet 200 disposed below the display panel 100. The panel lower sheet 200 may be attached to the back surface of the display panel 100. The panel lower sheet 200 includes at least one functional layer. The functional layer may be a layer that performs a heat dissipation function, an electromagnetic shielding function, a grounding function, a buffering function, a rigidity enhancing function, a supporting function, and/or a digitizing function. The functional layer may be a sheet layer, a film layer, a thin layer, a coating layer, a panel, a plate, or the like. One functional layer may be formed of a single layer or a stack of multiple thin films or coating layers. The functional layer may be, for example, a supporting substrate, a heat dissipation layer, an electromagnetic shielding layer, an impact absorbing layer, a digitizer, or the like.

The printed circuit film 300 may be bent downward in a third direction DR3 as shown in FIG. 2. The other side of the printed circuit film 300 and the main circuit board 500 may be located below the panel lower sheet 200. The lower surface of the panel lower sheet 200 may be coupled to the main circuit board 500 through an adhesive layer, but the present disclosure is not limited thereto.

The display panel 100 may include the first member 101, a plurality of conductive layers, a plurality of insulating layers for insulating them, an organic layer (EL), and the like. The organic layer EL, an anode electrode ANO and a cathode electrode CAT described later may constitute a light emitting element. The light emitting element may be provided plurally, and located in the display area DA.

The first member 101 is disposed over the entire area of the display area DA and the non-display area NA. A buffer layer 102 may be disposed on the first member 101. The buffer layer 102 may serve to prevent penetration of moisture and oxygen from the outside through the first member 101. The buffer layer 102 may include any one of a silicon nitride (SiNx) layer, a silicon oxide ($SiO_2$) layer and a silicon oxynitride (SiOxNy) layer.

A semiconductor layer 105 may be disposed on the buffer layer 102. The semiconductor layer 105 forms a channel of a thin film transistor. The semiconductor layer 105 is disposed in each pixel of the display area DA. In some embodiments, the semiconductor layer 105 may also be disposed in the non-display area NA in some cases. The semiconductor layer 105 may include a source/drain region and an active region. The semiconductor layer 105 may include polycrystalline silicon.

A first insulating layer 111 may be disposed on the semiconductor layer 105. The first insulating layer 111 may be disposed over the entire surface of the first member 101. The first insulating layer 111 may be a gate insulating layer having a gate insulating function. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. These may be used alone or in combination with each other.

A first conductive layer 120 may be disposed on the first insulating layer 111. The first conductive layer 120 may include a gate electrode GE of a thin film transistor TFT, and a first electrode CE1 of a storage capacitor Cst. Although not shown, the first conductive layer 120 may further include a gate signal wire. The gate signal wire may be arranged to pass through the display area DA and the panel pad area P_PA. The gate signal wire may be connected to a pad PAD of a third conductive layer 140 which will be described later. The first conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 120 may be a single layer or a multilayer stack of the above-mentioned material(s).

A second insulating layer 112 may be disposed on the first conductive layer 120. The second insulating layer 112 may insulate the first conductive layer 120 from a second conductive layer 130. The second insulating layer 112 may be selected from the above-mentioned materials of the first insulating layer 111. In the panel pad area P_PA, the second insulating layer 112 may further include a plurality of contact holes partially exposing the top surface of the gate signal wire. An electrical connection may be made between the pad PAD, which will be described later and the gate signal wire through the contact hole.

The second conductive layer 130 may be disposed on the second insulating layer 112. The second conductive layer 130 may include a second electrode CE2 of the storage capacitor Cst. The material of the second conductive layer 130 may be selected from the above-mentioned materials of the first conductive layer 120. The first electrode CE1 of the storage capacitor Cst and the second electrode CE2 of the storage capacitor Cst may form a capacitor with the second insulating layer 112 disposed therebetween.

A third insulating layer 113 may be disposed on the second conductive layer 130. The third insulating layer 113 may include at least one of the above-mentioned materials of the first insulating layer 111. In some embodiments, the third insulating layer 113 may include an organic insulating material. The organic insulating material may be selected from exemplary materials of a first via layer VIA1 to be described later.

A third conductive layer 140 may be disposed on the third insulating layer 113. The third conductive layer 140 may include a source electrode SE, a drain electrode DE, a high potential voltage electrode ELVDDE and the pad PAD. The third conductive layer 140 may include at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 140 may be a single layer made of the above-mentioned material. Without being limited thereto, the third conductive layer 140 may be a multilayer stack. For example, the third conductive layer 140 may have a stacked structure of Ti/Al/Ti, Mo/Al/Mo, Mo/AlGe/Mo, or Ti/Cu. In an exemplary embodiment, the third conductive layer 140 may include Ti/Al/Ti.

The pad PAD of the third conductive layer 140 may be disposed to overlap the gate signal wire of the first conductive layer 120 in the thickness direction, and may be electrically connected to the gate signal wire through the contact hole of the second insulating layer 112.

The pad PAD may be provided plurally. The plurality of pads PAD may be spaced apart from each other in the first direction DR1. Each pad PAD may be disposed to extend in the second direction DR2 from a first end of the panel pad area P_PA to a second end, opposite the first end, of the panel pad area P_PA. Each pad PAD may be connected to the gate signal wire and may be connected to the display area DA.

The first via layer VIA1 or a fourth insulating layer may be disposed on the third conductive layer 140. The first via layer VIA1 or the fourth insulating layer may include an organic insulating material or an inorganic insulating material. The organic insulating material may include at least one selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The inorganic insulating material may include at least one of the constituent materials of the first insulating layer 111 described above.

As illustrated in FIG. 2, the first via layer VIA1 may expose the top surface of the pad PAD in the panel pad area P_PA. The exposed pad PAD may be electrically connected to the printed circuit film 300 through an anisotropic conductive film ACF.

The printed circuit film 300 further includes a lead wire 320 on one surface of the first circuit area CA1 of the second member 310 and a circuit lead wire 330 on one surface of the third circuit area CA3. The lead wire 320 may be electrically connected to the pad PAD. In an exemplary embodiment, the lead wire 320 may be electrically connected to the top surface of the exposed pad PAD through the anisotropic conductive film ACF. The anisotropic conductive film ACF may include a bonding resin layer and conductive balls distributed in the bonding resin layer BSR.

Each of the lead wire 320 and the circuit lead wire 330 may include a metal material. Each of the lead wire 320 and the circuit lead wire 330 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In the illustrated embodiment, the lead wire 320 may include copper (Cu) and gold (Au).

The driving integrated circuit 390 may be disposed on the second circuit area CA2 of the second member 310. The driving integrated circuit 390 may be electrically connected to the lead wire 320 and the circuit lead wire 330.

Meanwhile, the printed circuit film 300 may further include an insulating resin SR disposed on the second member 310. The insulating resin SR may serve to prevent a short circuit between the adjacent lead wires 320. Further, the insulating resin SR may serve to prevent a short circuit between the adjacent circuit lead wires 330. As shown in FIG. 2, the insulating resin SR may expose a portion of the lead wire 320 overlapping the pad PAD and may cover and protect the remaining portion other than the portion. The portion of the lead wire 320 exposed by the insulating resin SR may be electrically connected to the pad PAD through the anisotropic conductive film ACF.

Figure 3:
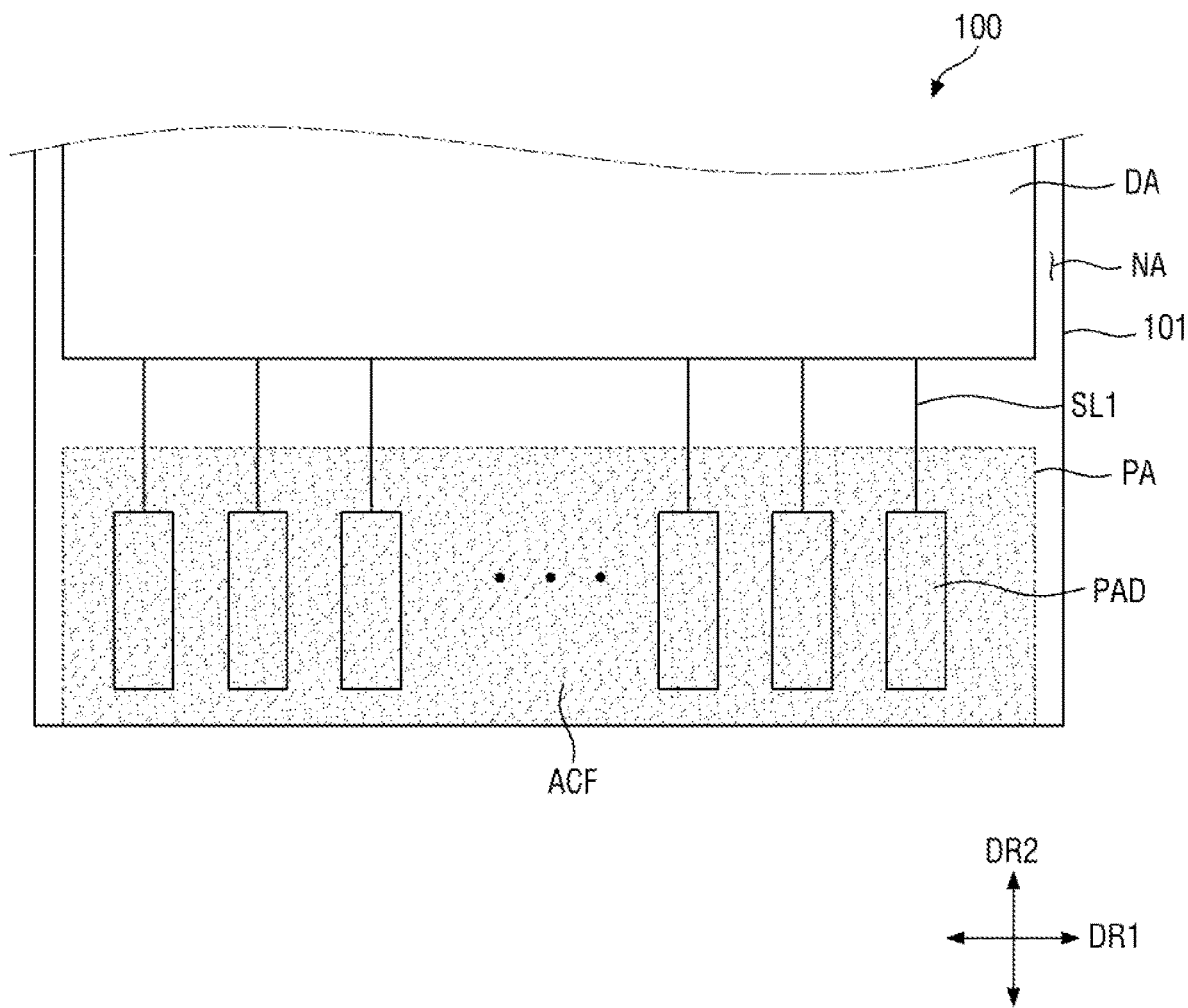
FIG. 3 is an enlarged plan view of a portion of a display panel.
Figure 4:
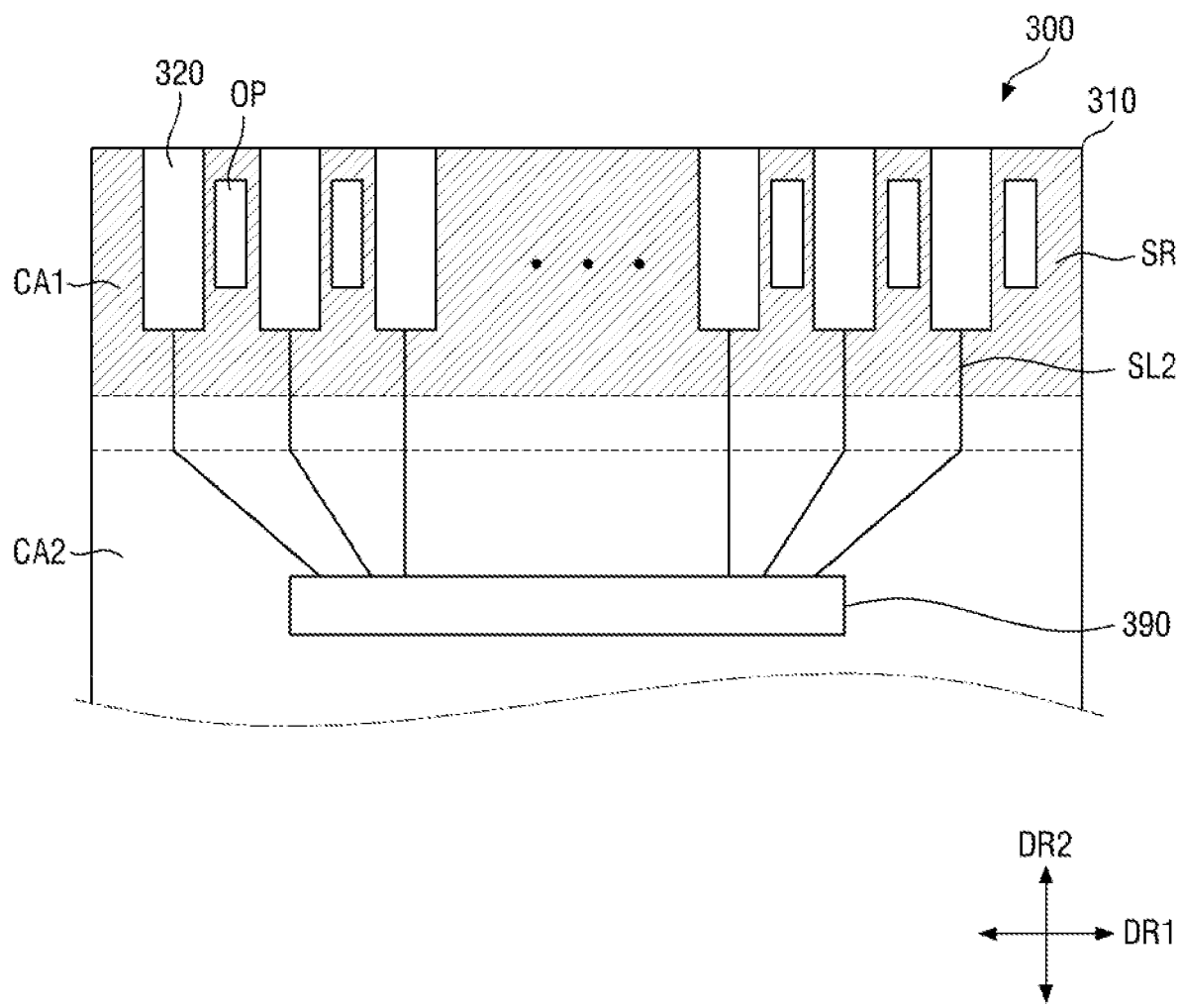
FIG. 4 is an enlarged plan view of a portion of a printed circuit film.
Figure 5:
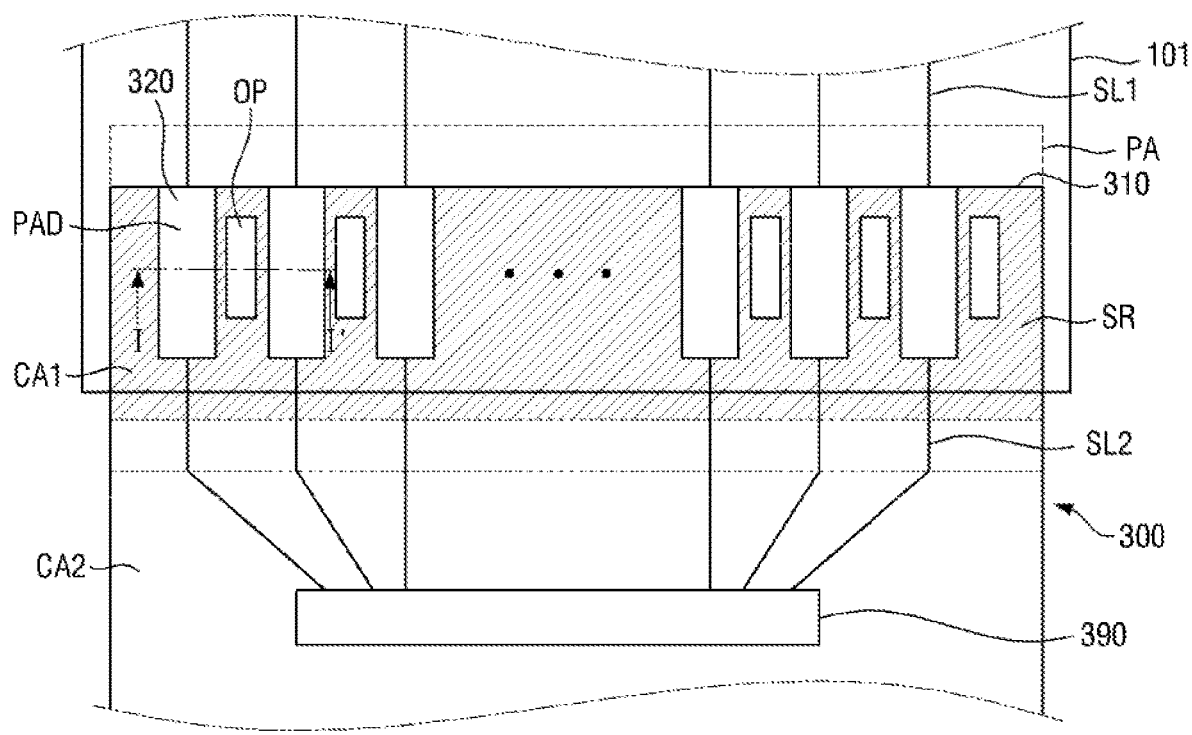
FIG. 5 is a plan layout view of the display panel of FIG. 3 and the printed circuit film of FIG. 4 attached thereto.
Figure 5:
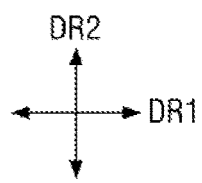
Figure 6:
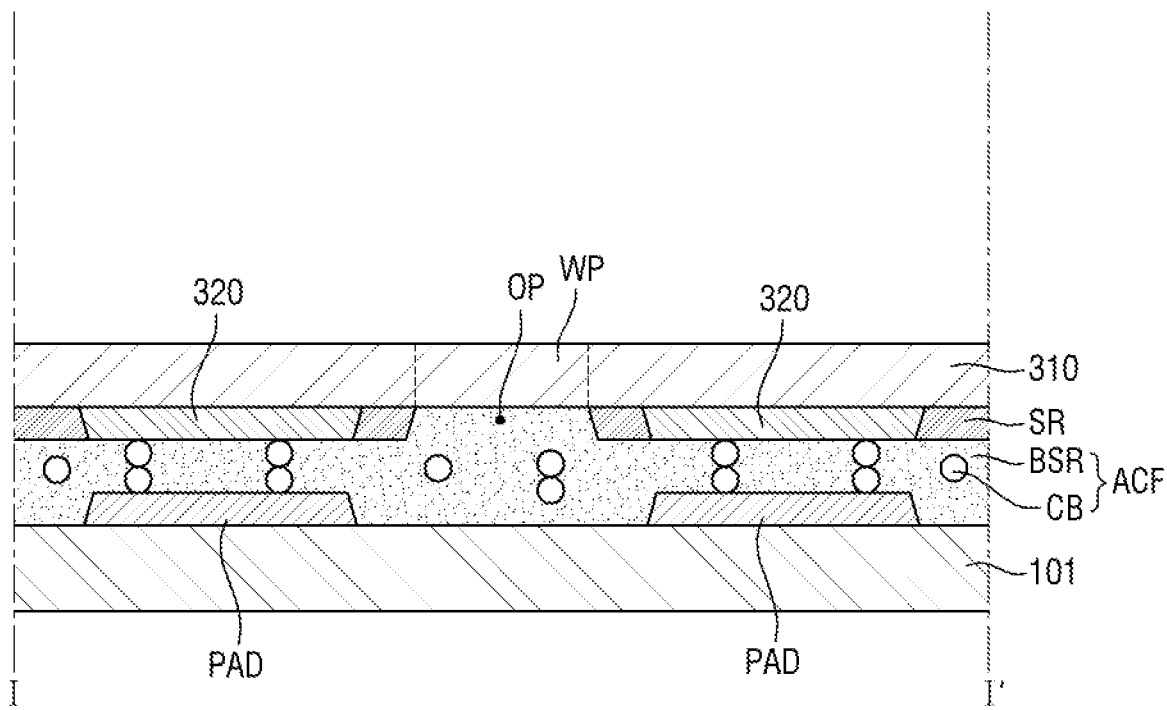
FIG. 6 is a cross-sectional view taken along line I-I' of FIG. 5.
Figure 7:
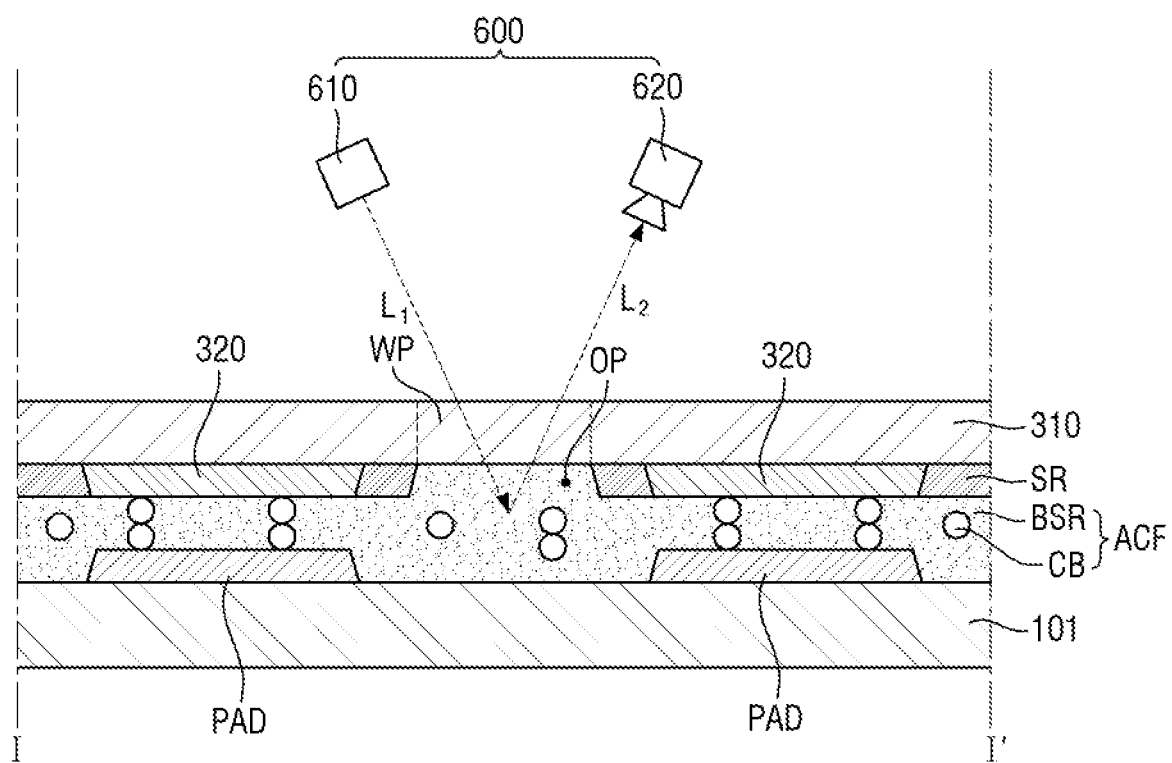
FIG. 7 is a schematic view illustrating measurement of a degree of cure of an anisotropic conductive film through a window portion.

FIG. 3 is an enlarged plan view of a portion of a display panel. FIG. 4 is an enlarged plan view of a portion of a printed circuit film. FIG. 5 is a plan layout view of the display panel of FIG. 3 and the printed circuit film of FIG. 4 attached thereto. FIG. 6 is a cross-sectional view taken along line I-I' of FIG. 5. FIG. 7 is a schematic view illustrating measurement of a degree of cure of the anisotropic conductive film through a window portion.

In FIG. 6, for simplicity of description, components between the first member 101 and the pad PAD are omitted, and the pad PAD is illustrated as directly on the first member 101.

Referring to FIGS. 3 to 7, a plurality of pads PAD may be disposed in the panel pad area P_PA. The pads PAD may be arranged along the first direction DR1. Although FIG. 3 illustrates that the plurality of pads PAD arranged along the first direction DR1 are arranged in one pad row, but the present disclosure is not limited thereto. The plurality of pads PAD may be arranged in a plurality of pad rows. In the following description, a case where a plurality of pads PAD form one pad row is described as an example. A gate signal line SL1 may electrically connect the pad PAD to the light emitting element of the display area DA. The pad PAD may have a larger width in the first direction DR1 than the gate signal line SL1.

The anisotropic conductive film ACF may be disposed on the plurality of pads PAD. The planar anisotropic conductive film ACF may cover and overlap the pad row formed by the plurality of pads PAD. The pad PAD may be connected to the display area DA through the gate signal line SL1. The planar shape of the pad PAD may be rectangular. The anisotropic conductive film ACF may be disposed to extend in the second direction DR2 from one short side of each of the plurality of pads PAD adjacent to the display area DA to the other short side opposite to the one short side, and may be disposed to extend in the first direction DR1 from the leftmost pad PAD to the rightmost pad PAD.

The anisotropic conductive film ACF is not cured before bonding of the display panel 100 and the printed circuit film 300 to each other, but may be thermally cured or cured using ultraviolet light after the printed circuit film 300 is disposed on the display panel 100.

A window portion WP between the lead wires 320 adjacent to each other in a plan view may be defined in the second member 310. For example, the window portion WP may be disposed between the lead wires 320 adjacent to each other in a plan view. The window portion WP may be configured to measure the degree of cure of the anisotropic conductive film ACF after the printed circuit film 300 is attached to the display panel 100 as described below.

The lead wire 320 may have a rectangular shape in a plan view. The planar shape of the lead wire 320 may be substantially the same as that of the pad PAD.

The lead wire 320 may be connected to the driving integrated circuit 390 through a lead connection wire SL2. The lead connection wire SL2 may be integrally formed with the lead wire 320. The lead wire 320 may have a larger width in the first direction DR1 than the lead connection wire SL2.

The insulating resin SR may be further disposed on the second member 310. The insulating resin SR may serve to prevent a short circuit between the adjacent lead wires 320. The insulating resin SR may include an opaque insulating resin. The insulating resin SR may include an optically opaque insulating resin.

The insulating resin SR may surround, except for one short side of the lead wire 320 on the end side of the printed circuit film 300 in a plan view, the other short side opposite to the one short side and long sides of the lead wire 320. The insulating resin SR may further include an open portion (i.e., an opening) OP passing therethrough in the thickness direction. The open portion OP may completely pass through the insulating resin SR in the thickness direction. The open portion OP of the insulating resin SR may be completely surrounded by an insulating resin material of the insulating resin SR. The open portion OP of the insulating resin SR may be disposed between the lead wires 320 adjacent to each other in a plan view. The open portion OP of the insulating resin SR may be disposed to overlap the window portion defined in the second member 310 in the thickness direction. The open portion OP may not overlap the lead wire 320 in the thickness direction.

In an exemplary embodiment, the planar shape of the window portion WP may be a rectangular shape. The planar size of the window portion may be smaller than the planar size of the adjacent lead wire 320. The planar shape of the window portion WP may be substantially the same as the planar shape of the open portion OP of the insulating resin SR. Further, the planar size of the window portion may be substantially the same as the planar size of the open portion OP of the insulating resin SR. In an exemplary embodiment, the window portion WP and the open portion OP of the insulating resin SR may be disposed to completely overlap each other in the thickness direction and have the same area.

The insulating resin SR may be in contact with the side surface of the lead wire 320. The insulating resin SR may be in contact with the anisotropic conductive film ACF. The surface height (with respect to the second member 310) of the insulating resin SR may be the same as the surface height (with respect to the second member 310) of the lead wire 320. The present invention, however, is not limited thereto.

In an exemplary embodiment, the surface height (with respect to the second member 310) of the insulating resin SR may be larger than or smaller than the surface height (with respect to the second member 310) of the lead wire 320.

The lead wire 320 of the second member 310 and one surface of the second member 310 on which the insulating resin SR is disposed may be partially exposed by the insulating resin SR. A portion partially exposed by the insulating resin SR may be the open portion OP. The open portion OP and the window portion WP defined in the second member 310 may overlap each other as described above. In the window portion WP, one surface of the second member 310 may be in contact with the anisotropic conductive film ACF.

The window portion WP of the second member 310 and the open portion OP of the insulating resin SR may be disposed to overlap the anisotropic conductive film ACF in the thickness direction.

The second member 310 and the first member 101 may be coupled to each other through the bonding resin layer BSR of the anisotropic conductive film ACF.

The degree of cure of the anisotropic conductive film ACF may be a major indicator for whether the display panel 100 and the printed circuit film 300 are bonded to each other. Although not limited thereto, when the degree of cure of the anisotropic conductive film ACF is about 70% or more, about 80% or more, or about 90% or more, it may be determined that the bonding reliability of the display panel 100 and the printed circuit film 300 is good.

To measure the degree of cure of the anisotropic conductive film ACF, a cure degree measuring apparatus 600 illustrated in FIG. 7 may be disposed above the printed circuit film 300 bonded to the display panel 100. The cure degree measuring apparatus 600 may include a light transmitting unit 610 which emits first light L1 to the anisotropic conductive film ACF through the window portion WP, and a light receiving unit 620 which receives second light L2 reflected from the anisotropic conductive film ACF through the window portion WP. The cure degree measuring apparatus 600 may be a Fourier-transform-infrared spectrometer (FTIR). The light L1, L2 may be a laser in an infrared or near-infrared wavelength band.

If the second member 310 includes a material having low light transmittance, the light L1, L2 transmitted and received by the cure degree measuring apparatus 600 may hardly pass through the window portion WP to reach the anisotropic conductive film ACF. In this case, after the bonding of the display panel 100 and the printed circuit film 300 is completed, the degree of cure of the anisotropic conductive film ACF may be measured by removing the printed circuit film 300 from the display panel 100 (destructive inspection) on a sample basis. However, the cured anisotropic conductive film ACF, after removed from the printed circuit film 300 and the display panel 100, may lose a tackifying force or an adhesive force, and thus the printed circuit film 300 may not be re-bonded to the display panel 100 using the cured anisotropic conductive film ACF. In the destructive inspection, a decrease in yield may occur at least by the number of the samples.

In the display device 1 according to an exemplary embodiment, the second member 310 includes a material having high light transmittance with respect to visible light. Accordingly, after bonding of the printed circuit film 300 and the display panel 100 is completed, it is possible to easily measure the degree of cure of the anisotropic conductive film ACF through the window portion without removing the printed circuit film 300 from the display panel 100 (non-destructive inspection). Thus, it is possible to prevent a reduction in the overall yield of the products. Further, it is possible to shorten the measurement time of the degree of cure because the measurement is performed without performing the step of removing the printed circuit film 300 in some samples of the products in which bonding of the display panel 100 and the printed circuit film 300 is completed, and the step of removing the printed circuit film 300 in some samples during the step of measuring the degree of cure of the anisotropic conductive film ACF.

Hereinafter, a display device according to exemplary embodiments will be described. In the following embodiments, the same components as those of the above-described embodiment are denoted by the same reference numerals, and a description thereof will be omitted or simplified.

Figure 8:
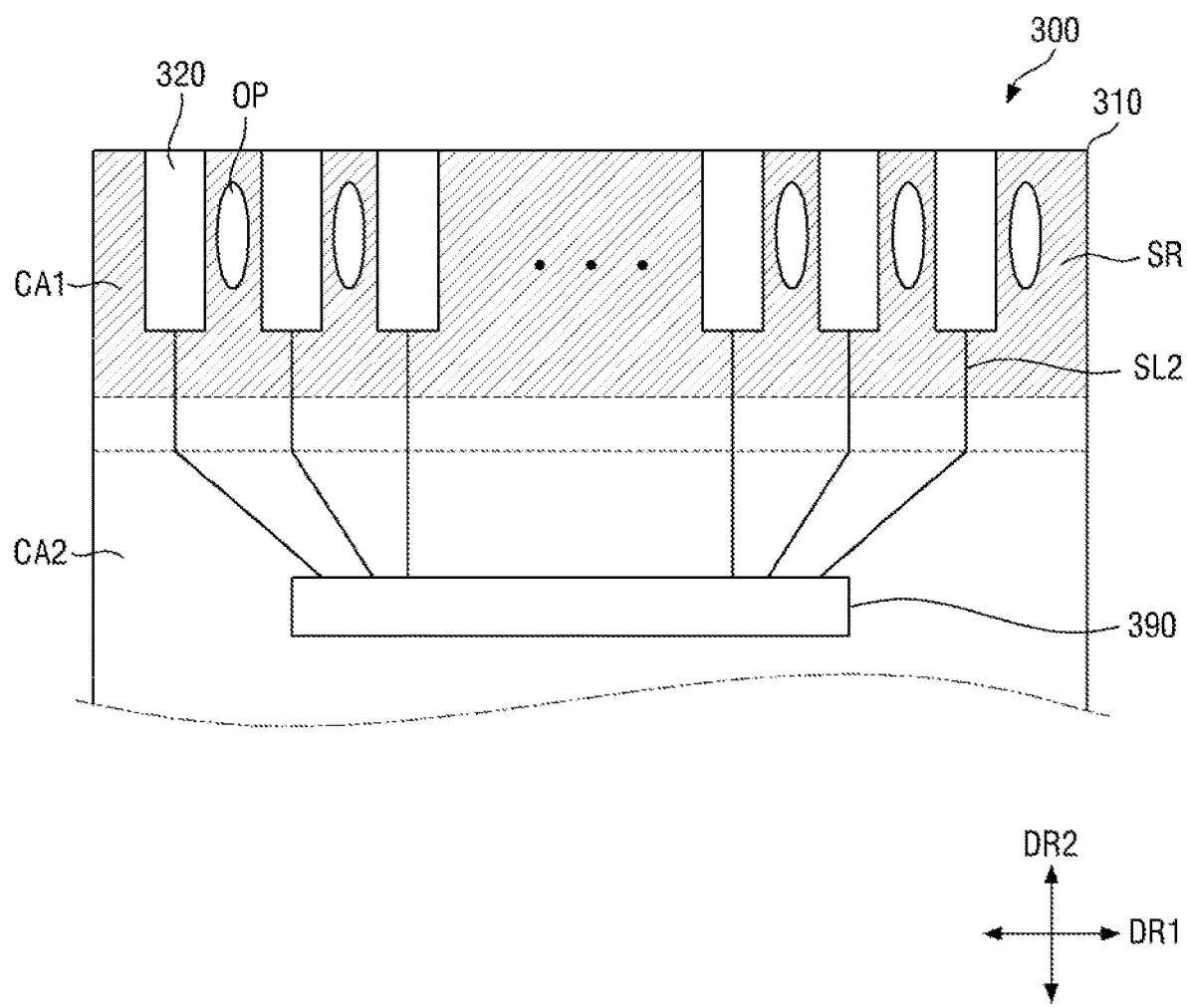
FIGS. 8 to 10 are plan views of modifications of the window portion.
Figure 9:
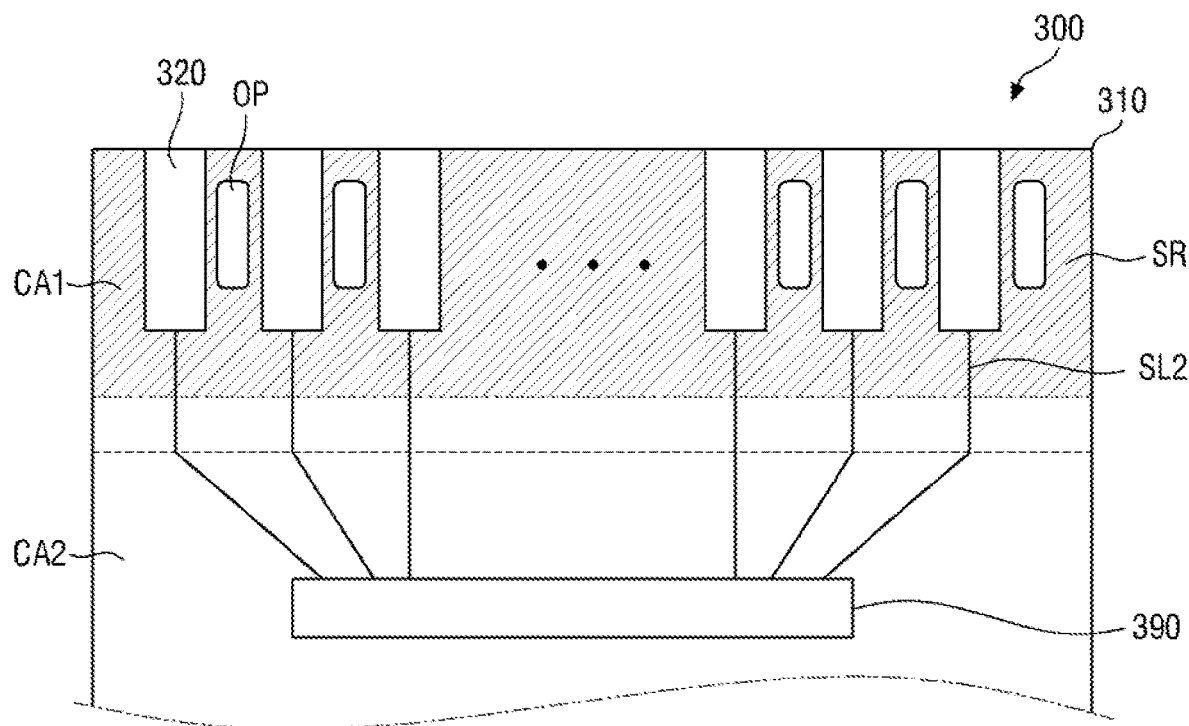
Figure 9:
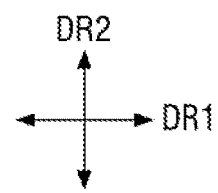
Figure 10:
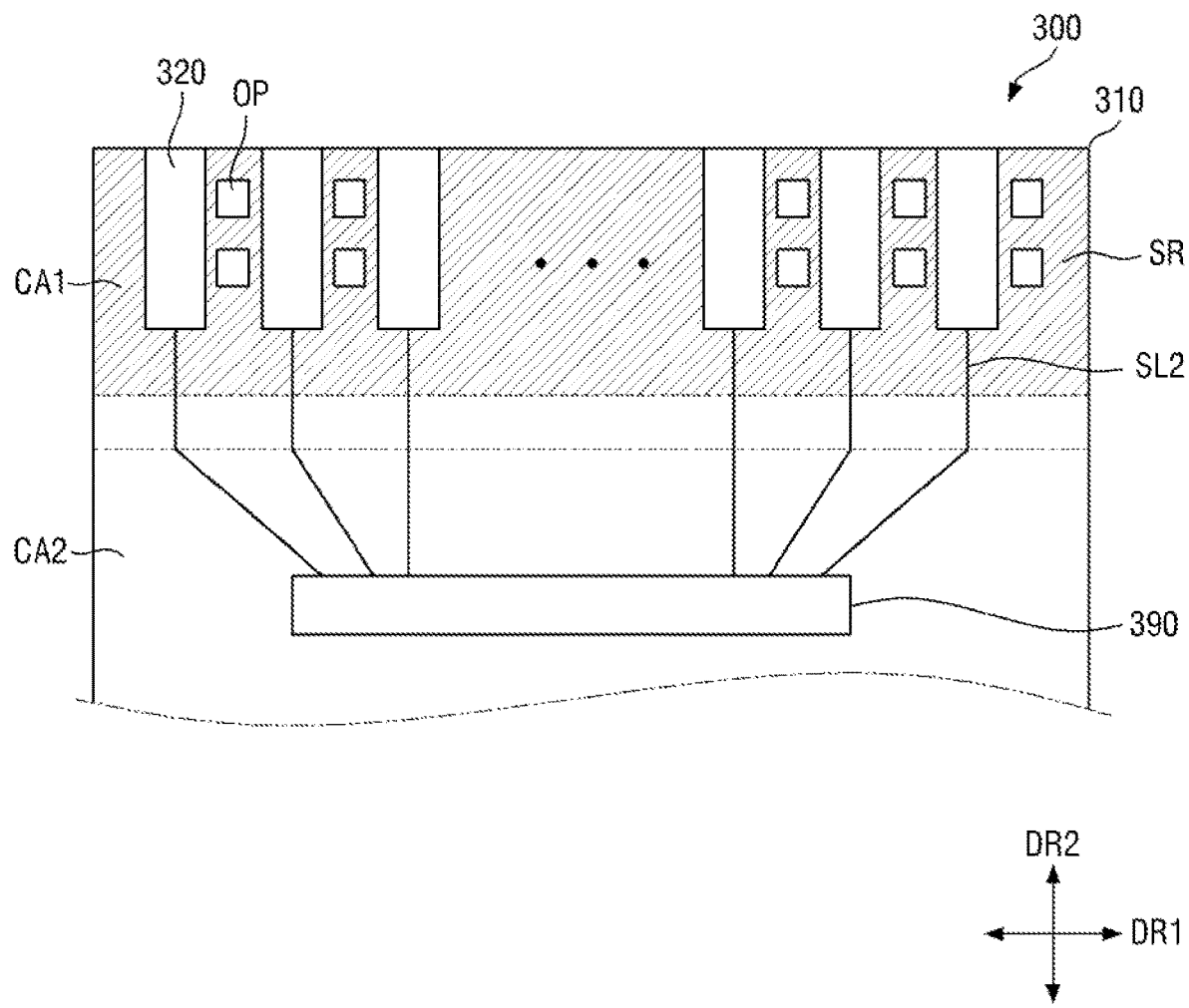

FIGS. 8 to 10 are plan views of modifications of the window portion.

The embodiment of FIG. 8 is different from the embodiment of FIG. 4 in that the open portion OP of the insulating resin SR has an elliptical shape in a plan view.

The embodiment of FIG. 9 is different from the embodiment of FIG. 4 in that the open portion OP of the insulating resin SR of FIG. 4 has a rectangular shape with angled corners in a plan view, while the open portion OP of the insulating resin SR of FIG. 9 has a rectangular shape with rounded corners in a plan view.

The embodiment of FIG. 10 is different from the embodiment of FIG. 4 in that the open portion OP of the insulating resin SR is provided plurally. In an exemplary embodiment, the plurality of open portions OP are arranged along the second direction DR2, and the plurality of open portions OP are disposed together between the adjacent lead wires 320.

Figure 11:
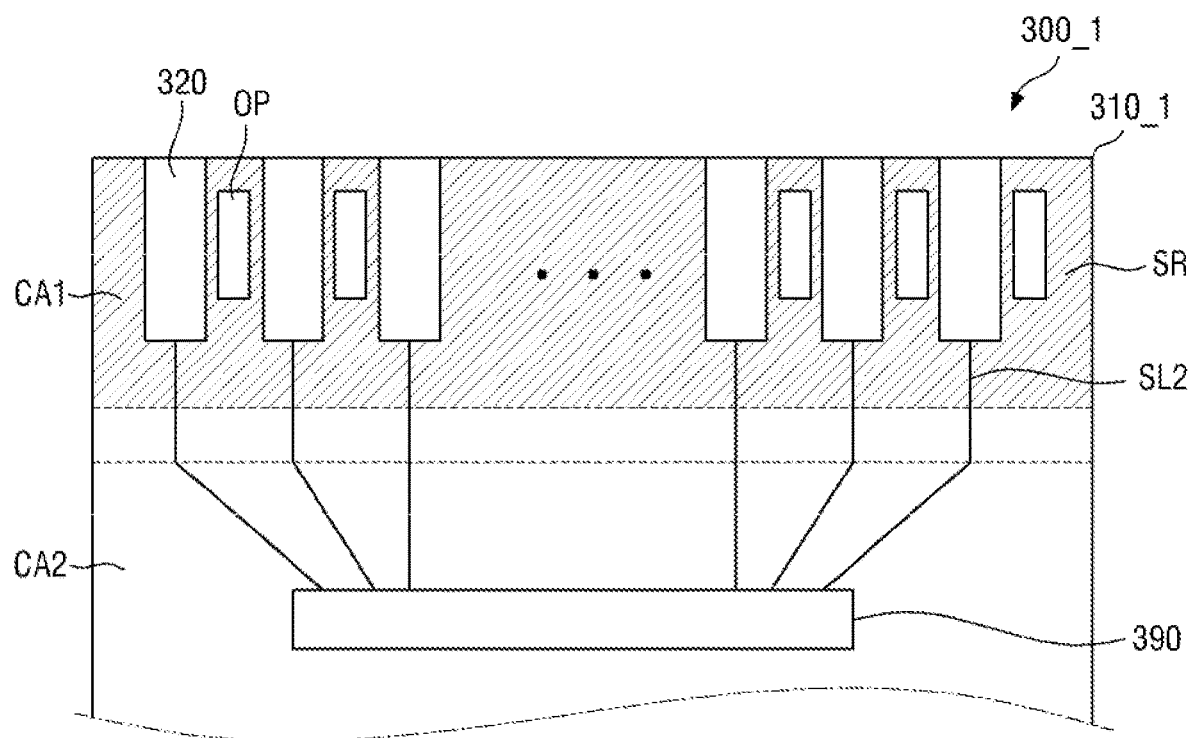
FIG. 11 is an enlarged plan view showing a portion of a printed circuit film according to an exemplary embodiment.
Figure 11:
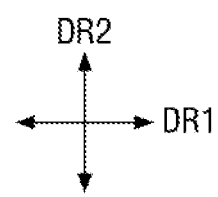
Figure 12:
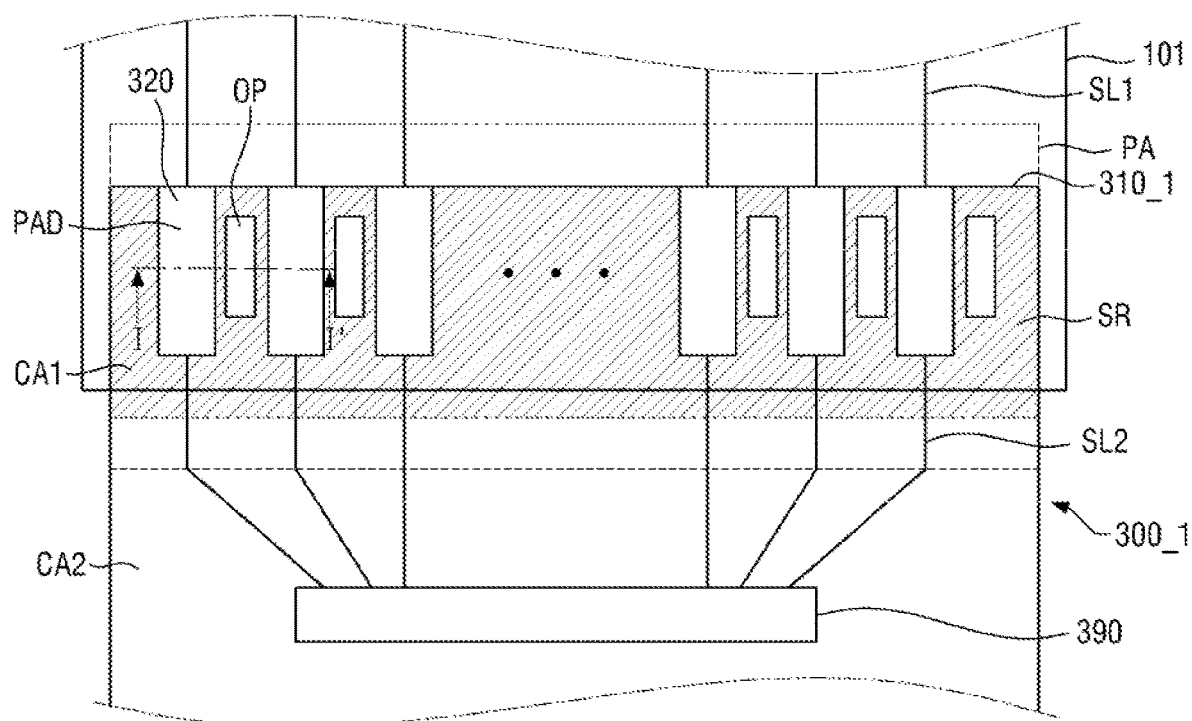
FIG. 12 is a plan layout view showing the printed circuit film according to an exemplary embodiment and the display panel according to the above-described embodiment, which are attached to each other.
Figure 12:
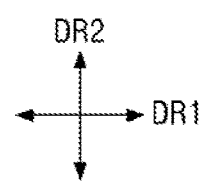
Figure 13:
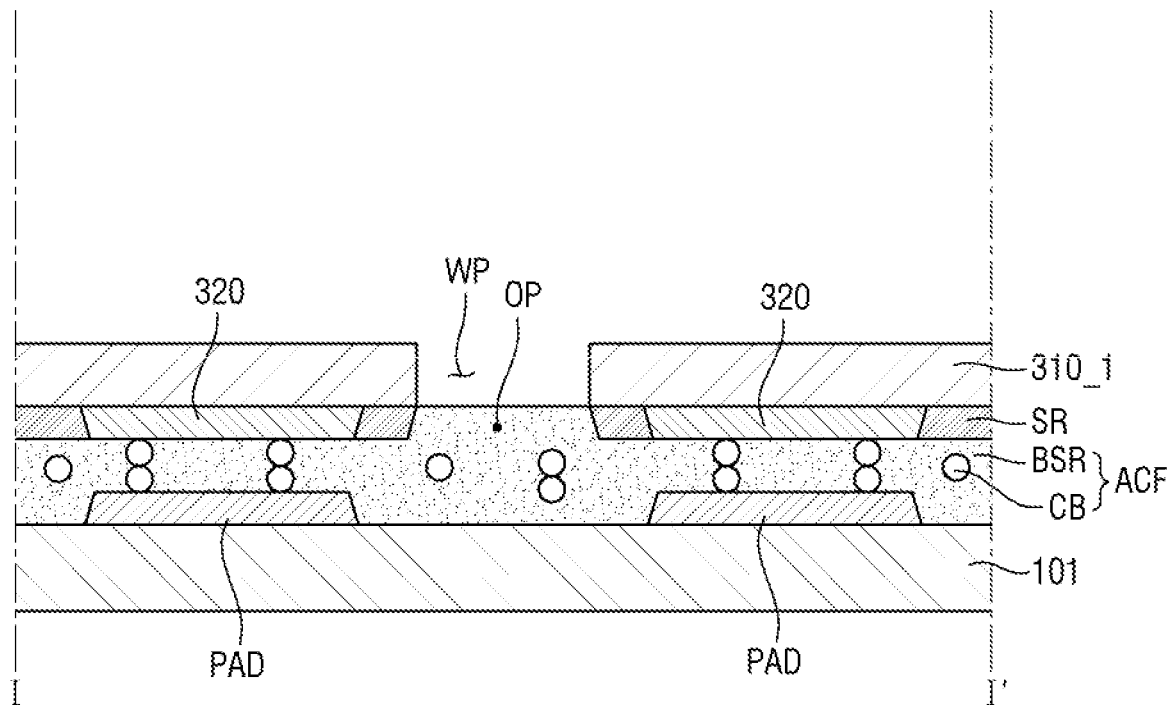
FIG. 13 is a cross-sectional view of the printed circuit film and the display panel of FIG. 12.

FIG. 11 is an enlarged plan view showing a portion of a printed circuit film according to an exemplary embodiment. FIG. 12 is a plan layout view showing the printed circuit film according to an exemplary embodiment and the display panel according to the above-described embodiment, which are attached to each other. FIG. 13 is a cross-sectional view of the printed circuit film and the display panel of FIG. 12.

Referring to FIGS. 11 to 13, a printed circuit film 300_1 according to the present embodiment is different from the printed circuit film 300 according to the above-described embodiment in that a second member 310_1 is perforated in the thickness direction in the window portion of the second member 310_1 of the printed circuit film 300_1.

For example, the second member 310_1 may be perforated in the thickness direction in the window portion of the second member 310_1 of the printed circuit film 300_1 according to the present embodiment. The window portion WP may overlap the open portion OP of the insulating resin SR. The open portion OP may have substantially the same planar shape and size as those of the window portion WP of the second member 310_1. The present invention, however, is not limited thereto. In an exemplary embodiment, the window portion WP may be greater than or smaller than the open portion OP in area. In an exemplary embodiment, the window portion WP and the open portion OP may have different shapes.

The second member 310_1 according to the present embodiment may include a material having high light transmittance similarly to the above-described embodiment. However, without being limited thereto, since the second member 310_1 according to the present embodiment is perforated to be removed in the window portion, the second member 310_1 according to the present embodiment may include an opaque insulating material unlike the second member 310 of the above-described embodiment. For example, the second member 310_1 may include at least one of polyimide (PI), polyimide (PI) containing fluorine ions (F—), cyclo-olefin polymer (COP), polyesterimide (PEI), or cyclo-olefin copolymer (COC).

In the display device according to the present embodiment, the second member 310_1 is perforated to be removed in the window portion. Accordingly, by extracting some samples after bonding of the printed circuit film 300_1 and the display panel 100 is completed, it is possible to easily measure the degree of cure of the anisotropic conductive film ACF overlappingly disposed in the corresponding area through the window portion without removing the printed circuit film 300_1 from the display panel 100 (non-destructive inspection). Thus, it is possible to prevent a reduction in the overall yield of the products. Further, it is possible to shorten the measurement time of the degree of cure because the measurement is performed without performing the step of removing the printed circuit film 300_1 in some samples of the products in which bonding of the display panel 100 and the printed circuit film 300_1 is completed, and the step of removing the printed circuit film 300_1 in some samples during the step of measuring the degree of cure of the anisotropic conductive film ACF.

Figure 14:
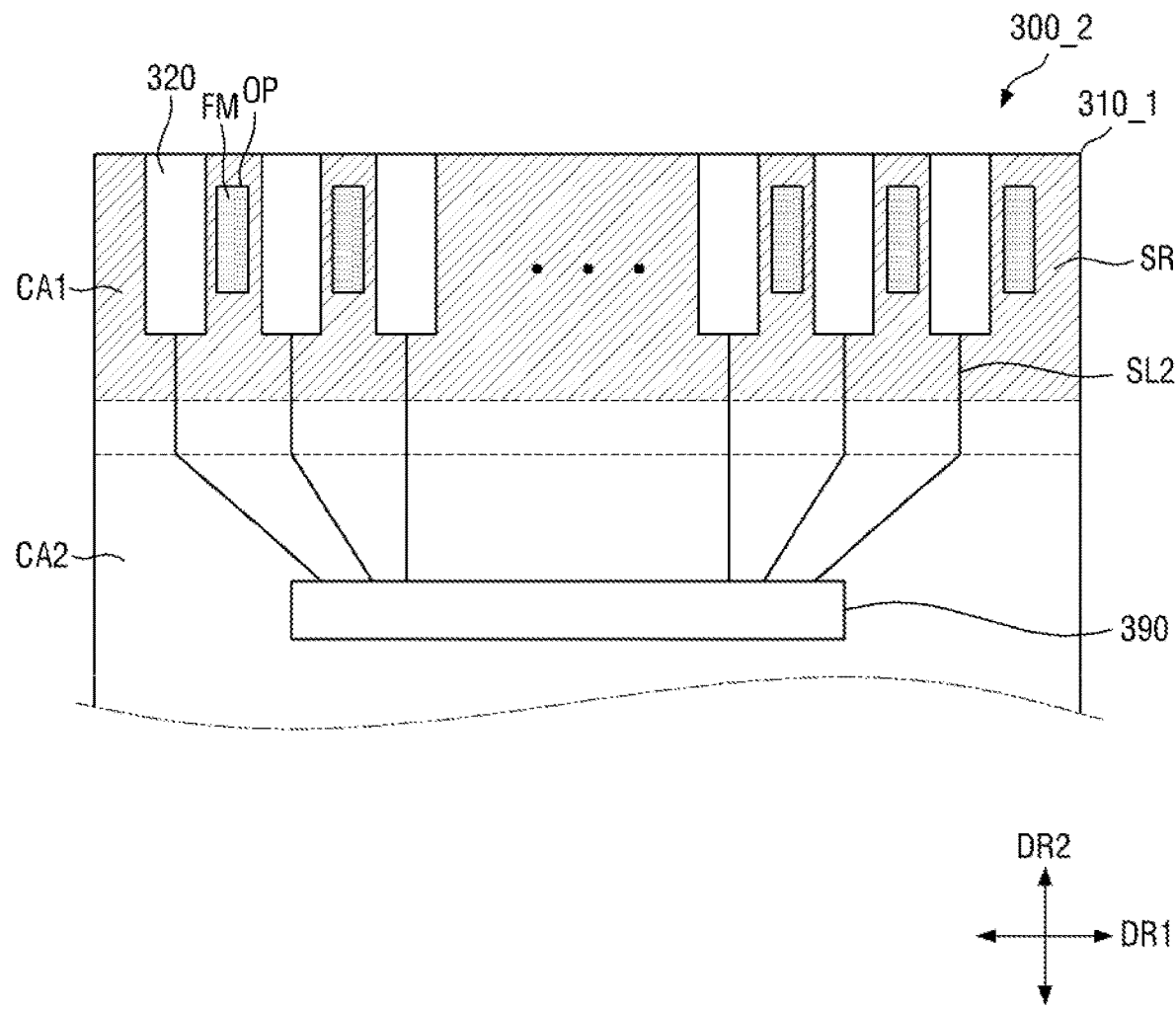
FIG. 14 is an enlarged plan view showing a portion of a printed circuit film according to an exemplary embodiment.
Figure 15:
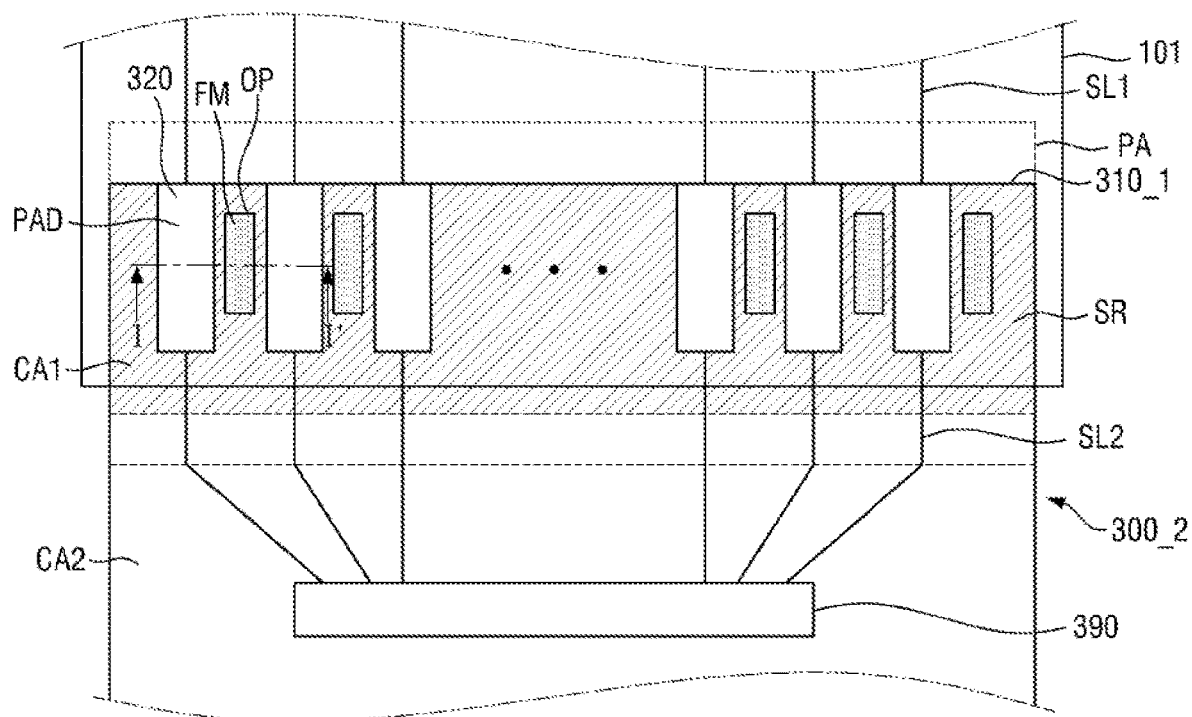
FIG. 15 is a plan layout view showing the printed circuit film according to an exemplary embodiment and the display panel according to the above-described embodiment, which are attached to each other.
Figure 15:
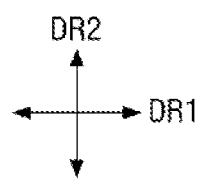
Figure 16:
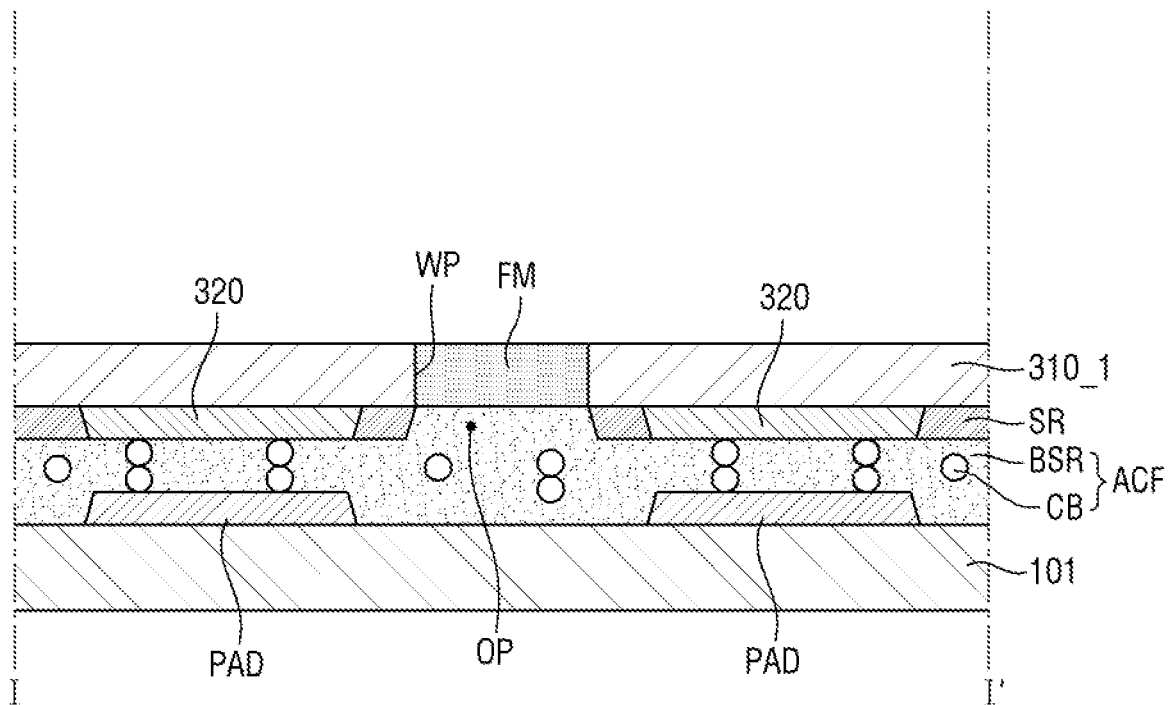
FIG. 16 is a cross-sectional view of the printed circuit film and the display panel of FIG. 15.

FIG. 14 is an enlarged plan view showing a portion of a printed circuit film according to an exemplary embodiment. FIG. 15 is a plan layout view showing the printed circuit film according to an exemplary embodiment and the display panel according to the above-described embodiment, which are attached to each other. FIG. 16 is a cross-sectional view of the printed circuit film and the display panel of FIG. 15.

Referring to FIGS. 14 to 16, the present embodiment is different from the embodiment of FIGS. 11 to 13 in that a printed circuit film 300_2 further includes a filling member FM filling the window portion of the second member 310_1.

In an exemplary embodiment, the display device according to the present embodiment may further include the filling member FM of the printed circuit film 300_2 to fill the window portion of the second member 310_1. The filling member FM may be a material having higher light transmittance than the second member 310_1. The filling member FM may be, for example, an insulating resin having light transmittance greater than that of the second member 310_1.

The filling member FM may be in contact with the side surface of the second member 310_1 in the window portion WP. The filling member FM may be disposed to overlap the window portion, and the filling member FM may be disposed to overlap the open portion OP of the insulating resin SR in a plan view. The filling member FM may have completely the same planar shape and size as the window portion WP and the open portion OP of the insulating resin SR. The present invention, however, is not limited thereto. In an exemplary embodiment, the filling member FM filling the window portion WP may be greater than or smaller than the open portion OP in area. In an exemplary embodiment, the filling member FM filling the window portion WP, and the open portion OP may have different shapes from each other.

In the present embodiment, the filling member FM may have the same surface height as one surface and the other surface of the second member 310_1. Before the second member 310_1 is bonded to the first member 101, the filling member FM may be formed by filling the window portion WP, and then polishing a first surface of the filling member FM adjacent to the one surface of the second member 310_1 and a second surface of the filling member FM adjacent to the other surface of the second member 310_1.

In some embodiments, when one surface of the second member 310_1 is disposed on a stage and the filling member FM is filled in the window portion of the second member 310_1, the first surface of the filling member FM in contact with the stage may have the same surface height as the one surface of the second member 310_1, but the second surface of the filling member FM may not have the same surface height as the other surface of the second member 310_1. When the second surface protrudes from the other surface, they may have the same surface height through the polishing.

FIGS. 17 to 22 are cross-sectional views according to modifications of FIG. 16.

Figure 17:
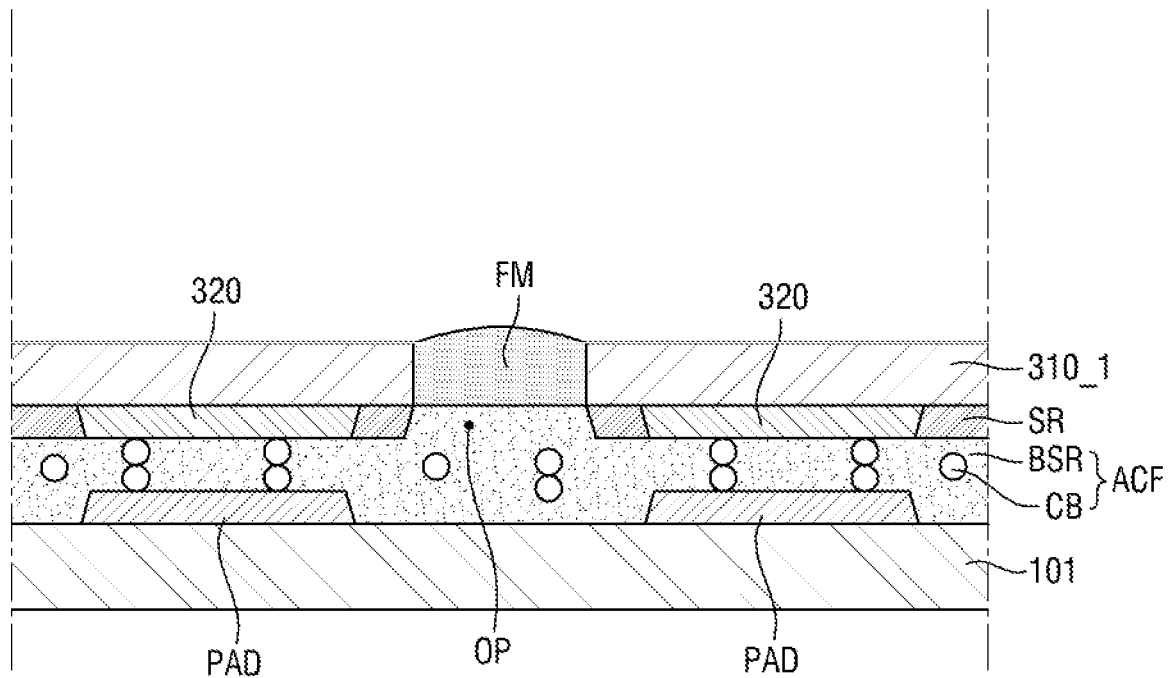
FIGS. 17 to 23 are cross-sectional views according to modifications of FIG. 16.

Referring to FIG. 17, it is different from the embodiment of FIG. 16 in that the first surface is aligned to have the same surface height as the one surface, and the second surface protrudes from the other surface.

Figure 18:
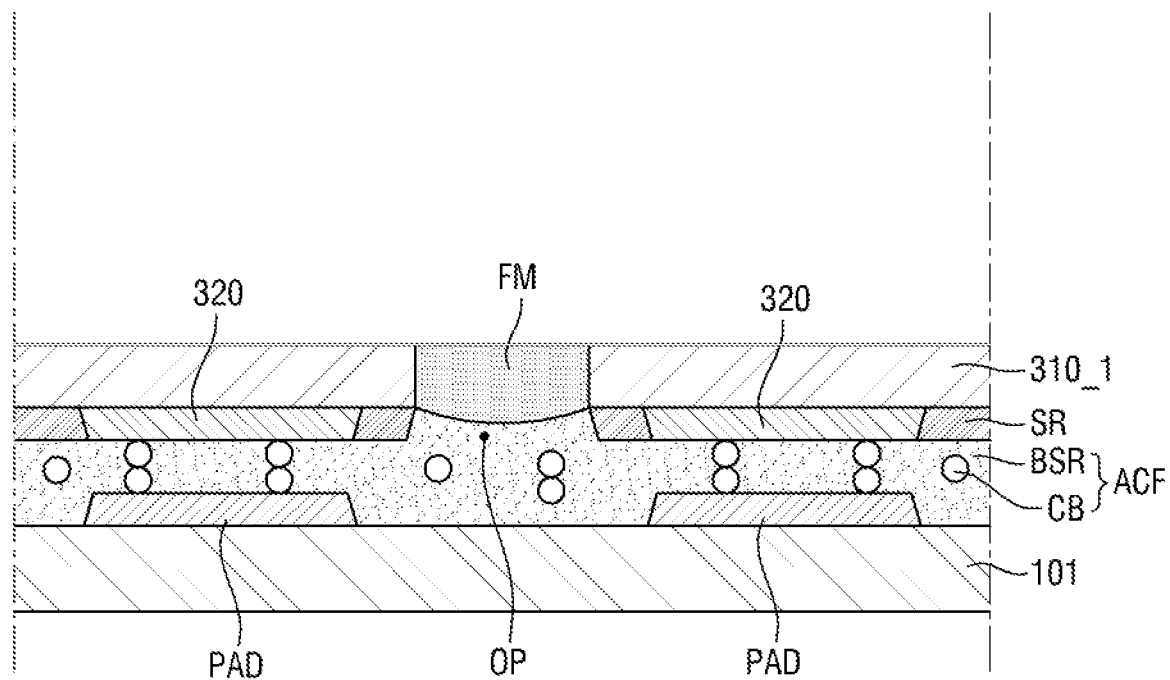

Referring to FIG. 18, it is different from the embodiment of FIG. 17 in that the second surface is aligned to have the same surface height as the other surface, and the first surface protrudes from the one surface, contrary to FIG. 17.

Figure 19:
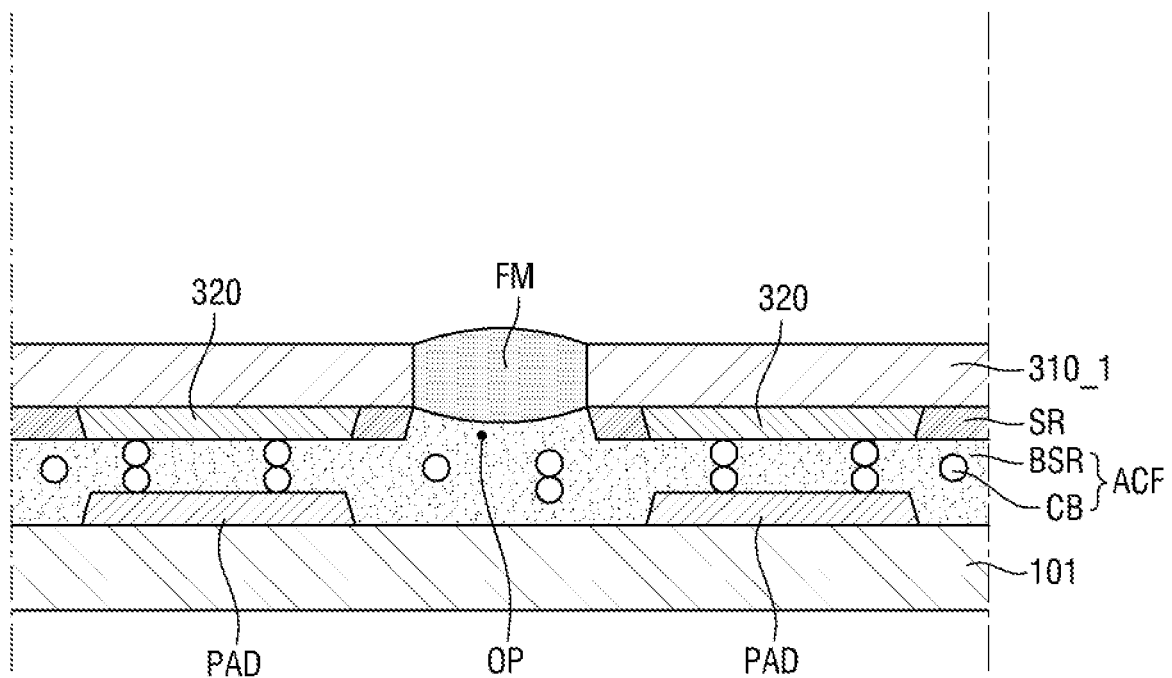

Referring to FIG. 19, it is different from the embodiment of FIG. 16 in that the first surface and the second surface protrude from the one surface and the other surface, respectively.

Figure 20:
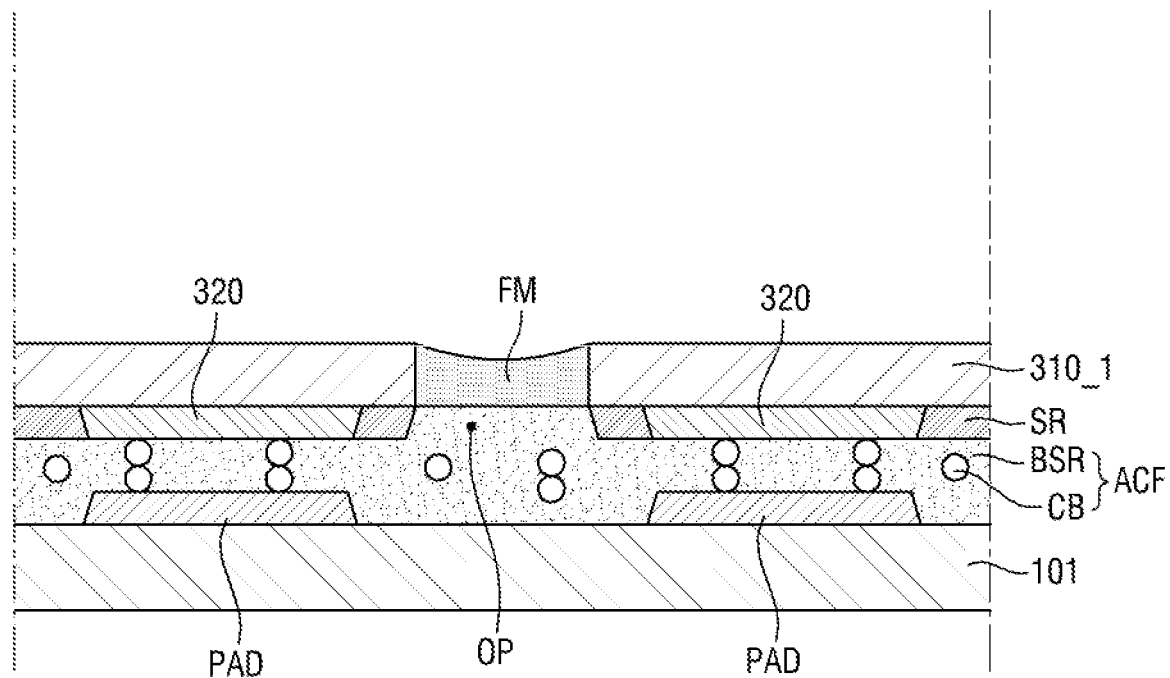

Referring to FIG. 20, it is different from the embodiment of FIG. 16 in that the first surface is aligned to have the same surface height as the one surface, but the second surface is recessed (to have a concave shape in the drawing) toward the first surface in comparison to the other surface.

Figure 21:
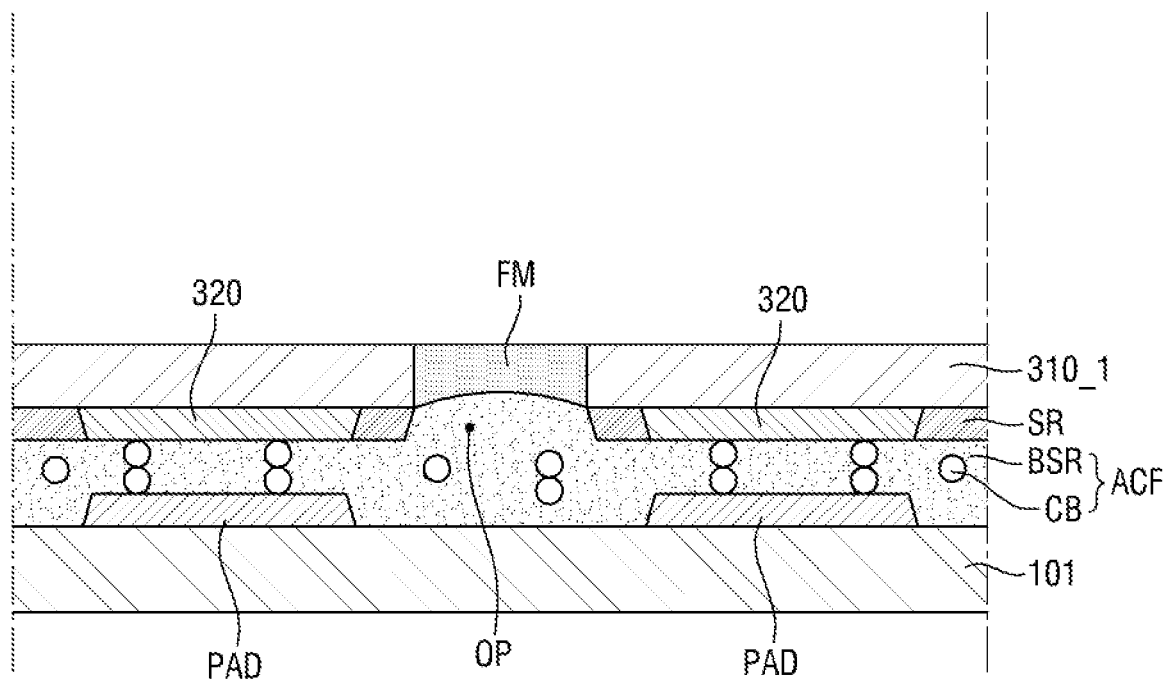

Referring to FIG. 21, it is different from the embodiment of FIG. 20 in that the second surface is aligned to have the same surface height as the other surface, but the first surface is recessed (to have a concave shape in the drawing) toward the second surface in comparison to the one surface, contrary to FIG. 20.

Figure 22:
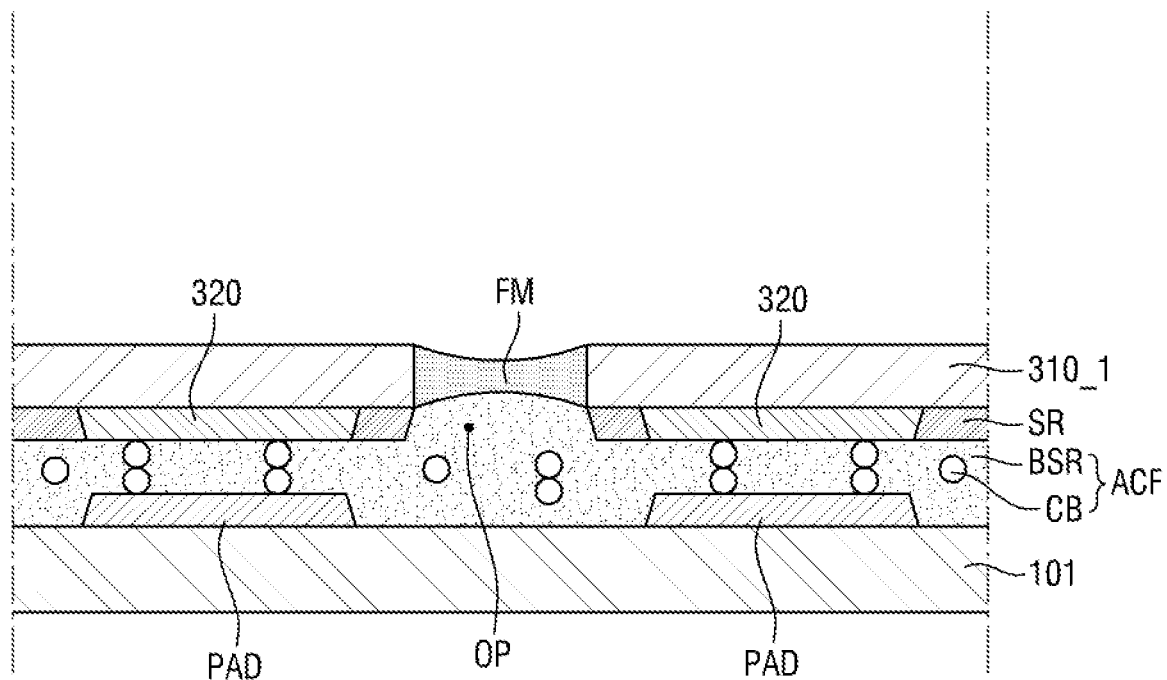

Referring to FIG. 22, it is different from the embodiment of FIG. 16 in that the first surface and the second surface are recessed (to have a concave shape in the drawing) in comparison to the one surface and the other surface, respectively.

Figure 23:
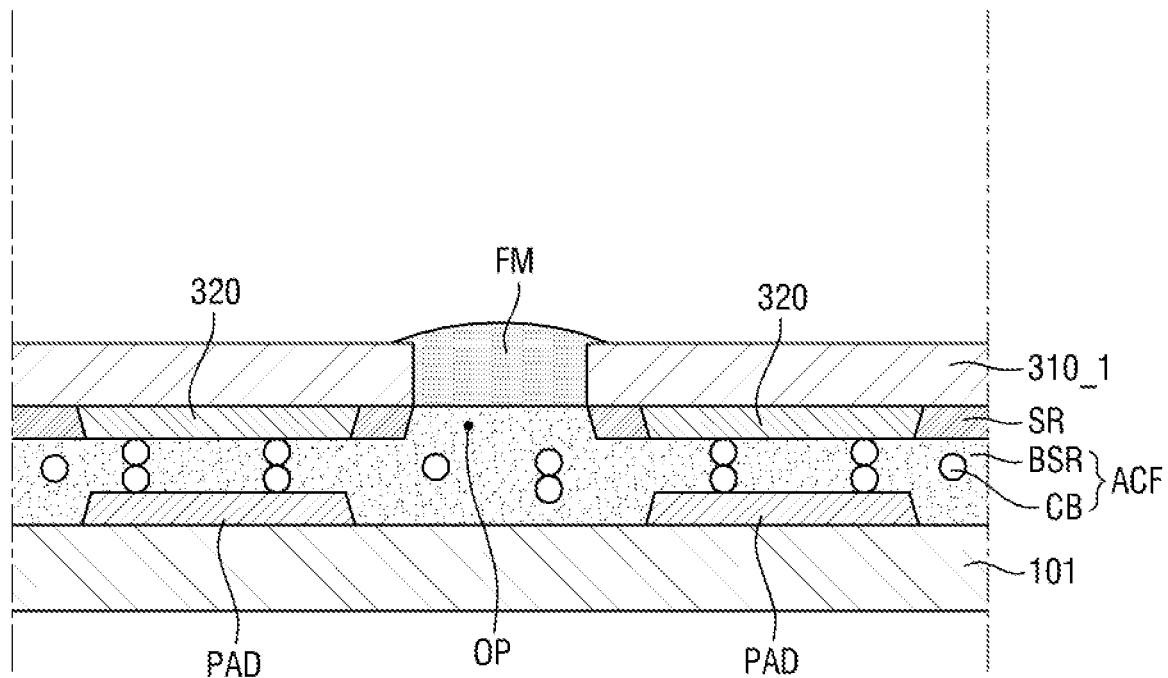

Referring to FIG. 23, it is different from the embodiment of FIG. 16 in that the surface height of the second surface is greater than that of the other surface, and the filling member FM extends (expands) to the other surface of the adjacent second member 310_1.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:
1. A display device comprising:
 a display substrate including a display area and a pad area located around the display area;
 a plurality of light emitting elements located on the display area of the display substrate;
 a plurality of pads located on the pad area of the display substrate and connected to the plurality of light emitting elements;
 a flexible film attached to the display substrate;
 a plurality of lead wires disposed on the flexible film;
 an anisotropic conductive film disposed between the display substrate and the flexible film,
 wherein the anisotropic conductive film is disposed between each of the plurality of pads and a correspond- ing one of the plurality of lead wires overlapping each other to form an electrical connection therebetween, and wherein the flexible film has a light transmittance of 60% or more with respect to a visible light wavelength range; and an insulating resin disposed on the flexible film, wherein the flexible film includes a window portion disposed between two lead wires adjacent to each other in a plan view, and wherein the insulating resin is disposed between the two lead wires adjacent to each other without overlapping the window portion.

2. The display device of claim 1,
wherein the window portion is surrounded by the insulating resin in the plan view.

3. The display device of claim 2,
wherein the insulating resin includes an opening passing therethrough in a thickness direction, and
wherein the opening is disposed to overlap the window portion.

4. The display device of claim 3,
wherein a portion of the anisotropic conductive film fills the opening of the insulating resin.

5. The display device of claim 4,
wherein the insulating resin includes an optically opaque insulating material.

6. The display device of claim 5,
wherein the opening has the same planar shape and size as the window portion.

7. The display device of claim 6,
wherein the flexible film includes transparent polyimide (PI) or transparent cyclo-olefin polymer (COP).

8. The display device of claim 7,
wherein the anisotropic conductive film is prepared through an ultraviolet curing or thermal curing process.

9. The display device of claim 8,
wherein the portion of the anisotropic conductive film is visible through the window portion, and
wherein the window portion is configured to pass through light for measuring a degree of cure of the anisotropic conductive film subjected to a curing process.

10. A display device comprising:
a display substrate including a display area and a pad area located around the display area;
a plurality of light emitting elements located on the display area;
a plurality of pads located on the pad area and connected to the plurality of light emitting elements;
a flexible film attached to the display substrate;
a plurality of lead wires disposed on the flexible film;
an insulating resin disposed on the flexible film; and
an anisotropic conductive film disposed between the display substrate and the flexible film, wherein the anisotropic conductive film is disposed between each of the plurality of pads and a corresponding one of the plurality of lead wires overlapping each other to form an electrical connection therebetween,
wherein the flexible film includes a first opening as a window portion,
wherein the first opening passes through the flexible film and is disposed between two lead wires adjacent to each other in a plan view, and
wherein the insulating resin is disposed between the two lead wires adjacent to each other without overlapping window portion.

11. The display device of claim 10,
wherein the window portion is surrounded by the insulating resin in the plan view.

12. The display device of claim 11,
wherein the insulating resin includes a second opening passing therethrough in a thickness direction, and
wherein the second opening is disposed to overlap the first opening.

13. The display device of claim 12,
wherein a portion of the anisotropic conductive film fills the second opening of the insulating resin.

14. The display device of claim 13,
wherein the insulating resin includes an optically opaque insulating material, and
wherein the second opening has the same planar shape and size as the first opening.

15. A display device comprising:
a display substrate including a display area and a pad area located around the display area;
a plurality of light emitting elements located on the display area;
a plurality of pads located on the pad area and connected to the plurality of light emitting elements;
a flexible film attached to the display substrate;
a plurality of lead wires disposed on the flexible film, wherein the flexible film includes a first opening as a window portion between two lead wires adjacent to each other a in a plan view, and wherein the first opening passes through the flexible film;
a filling resin filling the first opening of the flexible film;
an anisotropic conductive film disposed between the display substrate and the flexible film, wherein the anisotropic conductive film is disposed between each of the plurality of pads and a corresponding one of the plurality of lead wires overlapping each other to form an electrical connection therebetween; and
an insulating resin disposed on the flexible film, wherein the insulating resin is disposed between two lead wires adjacent to each other without overlapping the window portion.

16. The display device of claim 15,
wherein a light transmittance of the filling resin is greater than a light transmittance of the flexible film.

17. The display device of claim 15,
wherein the insulating resin includes a second opening passing therethrough in a thickness direction, and
wherein the second opening is disposed to overlap the filling resin filling the first opening.

18. The display device of claim 17,
wherein the insulating resin includes an optically opaque insulating material, and wherein the second opening has the same planar shape and size as the filling resin.

19. The display device of claim 15,
wherein the filling resin directly contacts the anisotropic conductive film.

* * * * *